US008558382B2

(12) United States Patent
Maeda et al.

(10) Patent No.: US 8,558,382 B2
(45) Date of Patent: Oct. 15, 2013

(54) INTERCONNECTION STRUCTURE AND DISPLAY DEVICE INCLUDING INTERCONNECTION STRUCTURE

(75) Inventors: Takeaki Maeda, Kobe (JP); Hiroshi Goto, Kobe (JP); Yumi Iwanari, Kobe (JP); Takayuki Hirano, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 13/387,557

(22) PCT Filed: Jul. 27, 2010

(86) PCT No.: PCT/JP2010/062649
§ 371 (c)(1),
(2), (4) Date: Jan. 27, 2012

(87) PCT Pub. No.: WO2011/013683
PCT Pub. Date: Feb. 3, 2011

(65) Prior Publication Data
US 2012/0126227 A1 May 24, 2012

(30) Foreign Application Priority Data

Jul. 27, 2009 (JP) ................. 2009-174801
Jul. 27, 2009 (JP) ................. 2009-174802
Jul. 27, 2009 (JP) ................. 2009-174803
Sep. 25, 2009 (JP) ................. 2009-221470
Sep. 25, 2009 (JP) ................. 2009-221471

(51) Int. Cl.
*H01L 23/48* (2006.01)
(52) U.S. Cl.
USPC ........................................ 257/751

(58) Field of Classification Search
USPC .................. 257/750, 751, 765, 767; 438/618
See application file for complete search history.

(56) References Cited

U.S. PATENT DOCUMENTS

| | | | |
|---|---|---|---|
| 5,514,909 A | 5/1996 | Yamamoto et al. |
| 6,033,542 A | 3/2000 | Yamamoto et al. |
| 6,096,438 A | 8/2000 | Takagi et al. |
| 6,218,206 B1 | 4/2001 | Inoue et al. |
| 6,252,247 B1 | 6/2001 | Sakata et al. |
| 7,098,539 B2 | 8/2006 | Gotoh et al. |
| 7,154,180 B2 | 12/2006 | Gotoh et al. |

(Continued)

FOREIGN PATENT DOCUMENTS

| | | |
|---|---|---|
| JP | 7 066423 | 3/1995 |
| JP | 8 8498 | 1/1996 |

(Continued)

OTHER PUBLICATIONS

Osada, et al., "Development of Driver-Integrated Panel using Amorphous In—Ga—Zn-Oxide TFT", The Proceeding of AM-FPD '09, pp. 33-36, Jul. 1-3, 2009.

(Continued)

*Primary Examiner* — Thao Le
(74) *Attorney, Agent, or Firm* — Oblon, Spivak, McClelland, Maier & Neustadt, L.L.P.

(57) ABSTRACT

A novel interconnection structure which is excellent in adhesion and is capable of realizing low resistance and low contact resistance is provided. An interconnection structure including an interconnection film and a semiconductor layer of a thin film transistor above a substrate in this order from the side of a substrate, wherein the semiconductor layer is composed of an oxide semiconductor, is provided.

19 Claims, 8 Drawing Sheets

(56) References Cited

U.S. PATENT DOCUMENTS

| | | |
|---|---|---|
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 7,553,754 B2 | 6/2009 | Gotoh et al. |
| 7,576,394 B2 * | 8/2009 | Furuta et al. .................. 257/347 |
| 7,622,809 B2 | 11/2009 | Gotoh et al. |
| 7,683,370 B2 | 3/2010 | Kugimiya et al. |
| 7,781,767 B2 | 8/2010 | Kawakami et al. |
| 7,803,238 B2 | 9/2010 | Kugimiya et al. |
| 7,943,933 B2 | 5/2011 | Hino et al. |
| 7,972,898 B2 * | 7/2011 | Cowdery-Corvan et al. . 438/104 |
| 7,994,503 B2 | 8/2011 | Hino et al. |
| 8,022,411 B2 * | 9/2011 | Yoon et al. ...................... 257/72 |
| 8,035,110 B2 * | 10/2011 | Kim et al. ........................ 257/72 |
| 8,044,399 B2 | 10/2011 | Hino et al. |
| 8,053,083 B2 | 11/2011 | Gotou et al. |
| 8,088,259 B2 | 1/2012 | Gotoh et al. |
| 8,183,102 B2 * | 5/2012 | Yamazaki et al. ............ 438/158 |
| 8,216,878 B2 * | 7/2012 | Sasaki et al. ................. 438/104 |
| 8,274,079 B2 * | 9/2012 | Yamazaki ........................ 257/43 |
| 2003/0047812 A1 | 3/2003 | Hagihara et al. |
| 2006/0091792 A1 | 5/2006 | Kugimiya et al. |
| 2006/0151788 A1 * | 7/2006 | Cho et al. ........................ 257/72 |
| 2006/0275618 A1 | 12/2006 | Kugimiya et al. |
| 2006/0292777 A1 | 12/2006 | Dunbar |
| 2007/0096098 A1 * | 5/2007 | Ishiga et al. .................... 257/59 |
| 2007/0108446 A1 | 5/2007 | Akimoto |
| 2008/0081532 A1 | 4/2008 | Okuno |
| 2008/0121522 A1 | 5/2008 | Ehira et al. |
| 2008/0223718 A1 | 9/2008 | Takagi et al. |
| 2009/0001373 A1 * | 1/2009 | Ochi et al. ...................... 257/59 |
| 2009/0011261 A1 | 1/2009 | Gotou |
| 2009/0026072 A1 | 1/2009 | Takagi et al. |
| 2009/0039350 A1 * | 2/2009 | Oh et al. ......................... 257/59 |
| 2009/0127550 A1 | 5/2009 | Imai |
| 2009/0133784 A1 | 5/2009 | Kugimiya et al. |
| 2009/0134393 A1 * | 5/2009 | Gotoh et al. .................... 257/59 |
| 2009/0140254 A1 * | 6/2009 | Ahn et al. ....................... 257/59 |
| 2009/0186445 A1 * | 7/2009 | Akimoto ........................ 438/104 |
| 2009/0189156 A1 * | 7/2009 | Akimoto ......................... 257/43 |
| 2009/0218570 A1 * | 9/2009 | Ha et al. .......................... 257/59 |
| 2009/0242394 A1 | 10/2009 | Takagi et al. |
| 2010/0012940 A1 * | 1/2010 | Sato ................................ 257/59 |
| 2010/0032186 A1 | 2/2010 | Gotou et al. |
| 2010/0038647 A1 * | 2/2010 | Cho et al. ........................ 257/72 |
| 2010/0065847 A1 | 3/2010 | Gotou et al. |
| 2010/0163873 A1 * | 7/2010 | Cho et al. ........................ 257/53 |
| 2010/0163877 A1 * | 7/2010 | Hino et al. ...................... 257/59 |
| 2010/0207121 A1 * | 8/2010 | Hino et al. ...................... 257/59 |
| 2010/0231116 A1 | 9/2010 | Ochi et al. |
| 2010/0283049 A1 * | 11/2010 | Sato et al. ....................... 257/43 |
| 2010/0301340 A1 * | 12/2010 | Shih et al. ....................... 257/59 |
| 2010/0301343 A1 * | 12/2010 | Qiu et al. ........................ 257/66 |
| 2010/0328247 A1 | 12/2010 | Miki et al. |
| 2011/0008640 A1 | 1/2011 | Goto et al. |
| 2011/0019350 A1 | 1/2011 | Nakai et al. |
| 2011/0024761 A1 | 2/2011 | Kawakami et al. |
| 2011/0050733 A1 * | 3/2011 | Yano et al. ..................... 345/690 |
| 2011/0121297 A1 | 5/2011 | Kawakami et al. |
| 2011/0147753 A1 * | 6/2011 | Onishi et al. ................... 257/59 |
| 2011/0175092 A1 * | 7/2011 | Yasuda et al. .................. 257/57 |
| 2011/0198602 A1 | 8/2011 | Nanbu et al. |
| 2011/0248272 A1 | 10/2011 | Ochi et al. |
| 2011/0273075 A1 | 11/2011 | Goto et al. |
| 2011/0318607 A1 | 12/2011 | Kobayashi et al. |
| 2012/0138943 A1 * | 6/2012 | Nakahara et al. .............. 257/59 |

FOREIGN PATENT DOCUMENTS

| | | |
|---|---|---|
| JP | 8 138461 | 5/1996 |
| JP | 11 283934 | 10/1999 |
| JP | 11 284195 | 12/1999 |
| JP | 11 337976 | 12/1999 |
| JP | 2002 076356 | 3/2002 |
| JP | 2003 273109 | 9/2003 |
| JP | 2004 349583 | 12/2004 |
| JP | 2007 165861 | 6/2007 |
| JP | 3979605 B2 | 9/2007 |
| JP | 2008 205451 | 9/2008 |
| JP | 2008 547237 | 12/2008 |
| JP | 2009-8770 A | 1/2009 |
| JP | 2009-70956 A | 4/2009 |
| JP | 2009-141341 | 6/2009 |
| JP | 2009 141341 | 6/2009 |
| KR | 10-2008-0000553 | 1/2008 |
| KR | 10-2008-0114575 | 12/2008 |
| KR | 10-2009-0027576 | 3/2009 |
| KR | 10-2009-0042245 | 4/2009 |

OTHER PUBLICATIONS

International Search Report issued on Nov. 2, 2010 in PCT/JP10/062649 filed on Jul. 27, 2010.
U.S. Appl. No. 13/387,522, filed Jan. 27, 2012, Goto, et al.
U.S. Appl. No. 13/877,065, filed Mar. 29, 2013, Maeda, et al.
U.S. Appl. No. 13/882,635, filed Apr. 30, 2013, Maeda, et al.
Office Action issued Feb. 21, 2013 in Korean Application No. 10-2012-7002083.
Office Action issued Jun. 12, 2013, in Korean Patent Application No. KR20137009988, filed Jul. 27, 2010.

* cited by examiner

Cu-Mn/GLASS SUBSTRATE INTERFACE

INTERCONNECTION STRUCTURE AND DISPLAY DEVICE INCLUDING INTERCONNECTION STRUCTURE

TECHNICAL FIELD

The present invention relates to an interconnection structure including an interconnection film and a semiconductor layer of a thin film transistor above a substrate in this order from the side of the substrate, wherein the semiconductor layer is composed of an oxide semiconductor layer composed of an oxide semiconductor, and a display device including the interconnection structure. The interconnection structure of the invention is representatively used for, for example, flat panel displays such as a liquid crystal display (liquid crystal display device) and an organic EL display. In the following, a liquid crystal display device will be representatively taken up and explained, but it should not be construed that the invention is limited thereto.

BACKGROUND ART

Liquid crystal display devices which are used in various fields including small-sized mobile phones and large-sized television exceeding 30 inches are formed from a thin film transistor (hereinafter referred to as "TFT") as a switching element; a transparent conductive film (oxide conductive film) constituting a pixel electrode; an interconnection part such as a gate interconnection and a source-drain interconnection; a TFT substrate including an Si semiconductor layer such as amorphous silicon (a-Si) and polycrystalline silicon (p-Si); a counter substrate which is disposed opposing the TFT substrate at a prescribed distance and includes a common electrode; and a liquid crystal layer filled between the TFT substrate and the counter substrate.

At present, as described above, a-Si is frequently used for the semiconductor layer of TFT for liquid crystal. But, next-generation displays are required to achieve large size, high resolution and high-speed driving. The conventional a-Si is low in carrier mobility, so that it is unable to satisfy such requirement specs. Then, in recent years, attention is paid to oxide semiconductors. The oxide semiconductors have a high carrier mobility as compared with a-Si. Furthermore, the oxide semiconductors can be formed with a large area at a low temperature by the sputtering method, and therefore, resin substrates having low heat resistance and the like can also be used. As a result, it is possible to realize a flexible display.

As an example of using such an oxide semiconductor for a semiconductor device, for example, in Patent Document 1, one obtained by using any one of zinc oxide (ZnO), cadmium oxide (CdO), and a compound or mixture of zinc oxide (ZnO) to which a IIB element, a IIA element or a VIB element is added, and doping with a 3d transition metal element, a rare earth element or an impurity capable of making the resistance high without losing transparency of the transparent semiconductor is used. Of the oxide semiconductors, oxides containing at least one or more elements selected from the group consisting of In, Ga, Zn, and Sn (e.g., IGZO, ZTO, IZO, ITO, ZnO, AZTO, GZTO) have a very high carrier mobility, and therefore, they are preferably used.

In display devices represented by liquid crystal display devices and the like, as interconnection materials of gate interconnections, source-drain interconnections or the like, pure Al or an Al-based alloy such as A—Nd, which is relatively small in electrical resistance and is easy for micromachining, is frequently used. But, with the progress of increase in size and high image quality of the display device, problems to be caused due to large interconnection resistance, such as signal delay and power loss, have been actualized. For that reason, copper (Cu) having lower resistance than Al is paid attention as the interconnection material. An electrical resistivity of an Al thin film is $3.0 \times 10^{-6} \Omega \cdot cm$, whereas an electrical resistivity of a Cu thin film is low as $2.0 \times 10^{-6} \Omega \cdot cm$.

But, Cu involves a problem that its adhesion to a glass substrate or an insulating film to be deposited thereon (a gate insulating film, etc.) is low, so that it peels off. Also, since Cu is low in adhesion to a glass substrate or the like, there is a problem that it is difficult to achieve wet etching or dry etching for processing into an interconnection shape. Then, there are proposed various technologies for enhancing the adhesion of Cu to a glass substrate.

For example, Patent Documents 2 to 4 disclose technologies for contriving to enhance the adhesion by allowing a layer of a high melting point metal such as molybdenum (Mo) and chromium (Cr) to intervene between the Cu interconnection and the glass substrate. But, according to such technologies, steps of depositing the high melting point metal layer increase, and manufacturing costs of a display device increase. Furthermore, in view of the fact that different metals, Cu and the high melting point metal (Mo, etc.), are laminated, there is a concern that corrosion is caused at an interface between Cu and the high melting point metal during the wet etching. Also, in such different metals, a difference in an etching rate is caused, and therefore, there may be a caused problem that an interconnection cross section cannot be formed into a desired shape (for example, a shape with a taper angle of from about 45 to 60°). Furthermore, an electrical resistivity of a high melting point metal, for example, that of Cr (about $15 \times 10^{-6} \Omega \cdot cm$), is higher than that of Cu, and signal delay or power loss, which is caused due to the interconnection resistance, become problematic.

On the other hand, when attention is paid to an interconnection structure of a TFT substrate including an oxide semiconductor layer, at present, an interconnection structure shown in FIG. 3 (which will be hereinafter sometimes referred to as "conventional structure" for the sake of convenience) is used as the structure of TFT for many purposes. In FIG. 3, a gate electrode, a gate insulating film, an oxide semiconductor film, and a source-drain electrode are formed in this order from the side of the substrate, and a metal electrode such as the source-drain electrode is formed on an upper layer of IGZO. The semiconductor device described in the above-described Patent Document 1 also includes this conventional structure. While FIG. 3 illustrates an example of a "bottom gate type" in which the gate electrode is located in a lower side, a "top gate type" in which the gate electrode is located in an upper side is also encompassed. Also, in the case of using an oxide semiconductor, a silicon oxide film or silicon oxynitride film is frequently used as the gate insulating film instead of silicon nitride film. This is because in the oxide semiconductor, its excellent properties are lost under a reducing atmosphere, and therefore, the use of silicon oxide (silicon oxynitride) capable of undergoing deposition under an oxidizing atmosphere is recommended.

But, the TFT substrate of the conventional structure using an oxide semiconductor such as IGZO involves the following problems. First of all, when forming an interconnection pattern by undergoing wet etching of a metal electrode (Cu based interconnection material), such as a source-drain electrode formed on an upper layer of IGZO, with the use of the acidic etching solution or the like, there is no etching selection ratio between IGZO and the Cu based interconnection material (in other words, the etching selectivity that only the Cu based interconnection material as the upper layer is selectively etched, but IGZO as the lower layer is not etched is small), and therefore, there is a problem that even the IGZO locating in the lower is damaged by etching. As a countermeasure thereto, for example, there is a proposed method of providing an etch stopper layer as a protective layer on a channel layer of IGZO. However, the steps become complicated, resulting in an increase of manufacturing costs. Secondly, the foregoing conventional structure involves a problem that when a heat history of about 250° C. or higher is applied, the contact resistance between the source-drain electrode and the oxide conductor increases. As for this issue, when a high melting point metal such as Ti is intervened, the increase of the contact resistance is suppressed. However, as described above, from the viewpoints of costs and productivity, an omission of the high melting point metal (barrier metal layer) is eagerly desired. Also, though Ti is deposited by means of dry etching using a plasma, it is difficult to apply them to interconnection materials which are hardly subjected to dry etching, such as Cu.

Then, in recent years, there is a proposed interconnection structure shown in FIG. 1 or 2 (which will be hereinafter sometimes referred to as "structure of the invention" for the sake of convenience for the purpose of being distinguished from the conventional structure of FIG. 3) in which the order of the oxide semiconductor film and the source-drain electrode is reverse to that of the conventional structure of FIG. 3 (for example, Non-Patent Document 1). This has a structure in which a gate electrode, a gate insulating film, a source-drain electrode, and an oxide semiconductor film are formed in this order from the side of the substrate. As shown in FIG. 1 or 2, an oxide semiconductor and a transparent conductive film (ITO in the drawings) which constitutes a pixel electrode are located on substantially the same plane as an interconnection material constituting the source-drain. While FIG. 1 or 2 illustrates an example of a "bottom gate type" in which the gate electrode is located in a lower side, a "top gate type" in which the gate electrode is located in an upper side is also encompassed, similar to the conventional structure shown in the above-described FIG. 3.

It may be considered that when the structure of the invention shown in FIG. 1 or 2 is adopted, the problems which the conventional structure of the above-described FIG. 3 involves can be dissolved. However, according to the structure of the invention, in the case where different materials, e.g. a high melting point metal (barrier metal layer) such as Ti and Mo, and pure Cu, etc. are laminated, there is a possibility that the contact resistance with the oxide semiconductor is different, and therefore, there is a problem that an effective channel length is not easily determined. That is, when a high melting point metal such as Ti and Mo is intervened above and below pure Cu, in the case where the contact resistance between Ti or Mo and the oxide semiconductor is larger than the value with pure Cu, or in the reverse case thereto, there is a problem that it is difficult to determine with ease which current is decided as the effective channel length between the current flowing source-drain electrode and the current flowing IGZO. Also, the above-described Non-Patent Document 1 discloses an interconnection structure in which Al is used as an interconnection material of the source-train interconnection, and Ti is intervened above and below the Al. However, the structure of the invention using, as the interconnection material, Cu having an electrical resistivity lower than Al has not been disclosed up to date.

Now, in TFT substrates using an oxide semiconductor represented by IGZO or the like, a single layer of Mo or Ti, or a laminated material in which a high melting point metal (barrier metal layer) such as Ti and Mo is intervened above and/or below pure Al or an Al alloy such as A—Nd (these will be hereinafter sometimes summarized and referred to as "Al based alloy") is mainly used as an interconnection material such as a gate interconnection and a source-drain interconnection. The Al-based alloy is adopted for the reasons that the electrical resistance is small, and micromachining is easily performed, and the like. Also, a main reason of using a high melting point metal for the interconnection material resides in the matter that Al is very easily oxidized, so that when the Al based alloy interconnection is connected directly to the oxide semiconductor layer, an insulating layer of high-resistance Al oxide is formed at an interface between the Al based alloy interconnection and the oxide semiconductor layer by oxygen generated in a deposition process of a liquid crystal display, oxygen added during the deposition, or the like, whereby the connection resistance to the oxide semiconductor layer (contact resistance) increases, and the display quality of a screen is lowered. However, the use of the high melting point metal brings about an increase of the costs or a lowering of the productivity, and therefore, taking mass production of a liquid crystal display into consideration, an omission of the high melting point metal is desired. That is, it is desirable to provide a novel interconnection material capable of reducing the contact resistance, even if the barrier metal layer is omitted to connect the Al based alloyed interconnection directly to the oxide conductor layer.

On the other hand, when attention is paid to an interconnection structure of a TFT substrate including an oxide semiconductor layer, at present, an interconnection structure shown in FIG. 5 (which will be hereinafter sometimes referred to as "conventional structure" for the sake of convenience) is used as the structure of TFT for many purposes. In FIG. 5, a gate electrode, a gate insulating film, a semiconductor film, and a source-drain electrode are formed in this order from the side of the substrate. While FIG. 5 illustrates an example of a "bottom gate type" in which the gate electrode is located in a lower side, a "top gate type" in which the gate electrode is located in an upper side also encompassed. Also, in the case of using an oxide semiconductor, $SiO_2$ or SiON is frequently used as the gate insulating film instead of SiN film. This is because in the oxide semiconductor, its excellent properties are lost under a reducing atmosphere, and therefore, the use of $SiO_2$ (SiON) capable of undergoing deposition under an oxidizing atmosphere is recommended.

But, the TFT substrate of the conventional structure using an oxide semiconductor such as IGZO involves the following problems. First of all, when forming an interconnection pattern by undergoing wet etching of a metal electrode (Al based interconnection material), such as a source-drain electrode formed on an upper layer of IGZO, with the use of the acidic etching solution, there is no etching selection ratio between IGZO and the Al based interconnection material (in other words, the etching selectivity that only the Al based interconnection material as the upper layer is selectively etched, but IGZO as the lower layer is not etched, is small), and therefore, there is a problem that even the IGZO locating in the lower is damaged by etching. As a countermeasure thereto, for example, there is a proposed method of providing an etch stopper layer as a protective layer on a channel layer of IGZO. However, the steps become complicated, resulting in an increase of manufacturing costs. Secondly, the foregoing conventional structure involves a problem that when a heat history of about 250° C. or higher is applied, the contact resistance between the source-drain electrode and the oxide conductor increases. As for this issue, when a high melting point metal such as Ti is intervened, the increase of the contact resistance is suppressed. However, as described above, from the viewpoints of costs and productivity, an omission of the high melting point metal (barrier metal layer) is eagerly desired. Also, though Ti is deposited by means of dry etching using a plasma, it is difficult to apply them to interconnection materials which are hardly subjected to dry etching, such as Cu.

Then, in recent years, there is a proposed interconnection structure shown in FIG. 4 (which will be hereinafter sometimes referred to as "structure of the invention" for the sake of convenience for the purpose of being distinguished from the conventional structure of FIG. 5) in which the order of the oxide semiconductor film and the source-drain electrode is reverse to that of the conventional structure of FIG. 5. This has a structure in which a gate electrode, a gate insulating film, a source-drain electrode, and an oxide semiconductor film are formed in this order from the side of the substrate. As shown in FIG. 4, an oxide semiconductor and a transparent conductive film (ITO in the drawing) which constitutes a pixel electrode are located on substantially the same plane as an interconnection material constituting the source-drain. While FIG. 4 illustrates an example of a "bottom gate type" in which the gate electrode is located in a lower side, a "top gate type" in which the gate electrode is located in an upper side is also encompassed, similar to the conventional structure shown in the above-described FIG. 5.

It may be considered that when the structure of the invention shown in FIG. 4 is adopted, the problems which the conventional structure of the above-described FIG. 5 involves can be dissolved. However, according to the structure of the invention, in the case where a high melting point metal (barrier metal layer), such as Ti and Mo, is intervened in a material which is not able to come into direct contact with the oxide semiconductor, such as pure Al, there is a problem that an effective channel length is not determined. That is, when a high melting point metal such as Ti and Mo is intervened above and below the pure Al, pure Al and IGZO cannot be electrically connected to each other, and therefore, there is a problem that it is difficult to determine with ease which current is decided as the effective channel length between the current flowing source-drain electrode and the current flowing IGZO (for example, the upper side and the lower side).

PRIOR ART DOCUMENTS

Patent Documents

Patent Document 1: JP-A-2002-76356
Patent Document 2: JP-A-7-66423
Patent Document 3: JP-A-8-8498
Patent Document 4: JP-A-8-138461

Non-Patent Document

Non-Patent Document 1: Takeshi Osada, et al., "Development of Driver-Integrated Panel using Amorphous In—Ga—Zn-Oxide TFT", THE PROCEEDING OF AM-FPD '09, pp. 33-36, Jul. 1-3, 2009

SUMMARY OF THE INVENTION

Problems to be Solved by the Invention

Then, it is eagerly desired to provide an interconnection structure including a Cu alloy film which is a novel Cu alloy film applicable to the interconnection structure shown in FIG. 1 and which has excellent adhesion thereto and keeps low electrical resistance and low contact resistance with an oxide semiconductor layer and/or a transparent conductive film constituting a pixel electrode as characteristic features of a Cu based material, even when electrically connected directly to a substrate and/or an insulating film provided on a substrate and composed of silicon oxide, silicon oxynitride, or the like while omitting a barrier metal layer.

Also, it is eagerly desired to provide an interconnection structure including an Al alloy film which is a novel Al alloy film applicable to the interconnection structure of the invention shown in FIG. 4 and which has controlled resistance in a low level even when electrically connected directly to an oxide semiconductor layer while omitting a barrier metal layer.

Under the foregoing circumstances, the invention has been made. A first object is to provide an interconnection structure having a novel Cu alloy film for display device, wherein the interconnection structure includes an insulating film, a Cu alloy film, and an oxide semiconductor layer of a thin film transistor in this order from the side of the substrate, which has excellent adhesion thereto and is capable of realizing low electrical resistance and low contact resistance (contact electrical resistance with an oxide semiconductor layer and/or a transparent conductive film constituting a pixel electrode) as characteristic features of a Cu based material, even when the Cu alloy film is electrically connected directly to the substrate and/or the insulating film while omitting a high melting point metal (barrier metal layer) such as Ti and Mo, and a display device including the interconnection structure.

A second object is to provide a novel interconnection structure in which a film constituting a metal electrode such as a source-drain electrode is formed under an oxide semiconductor layer of a thin film transistor, and in particular an interconnection structure capable of surely realizing low electrical resistance against the oxide semiconductor layer with good reproducibility, and a display device including the interconnection structure.

A third object is to provide an interconnection structure having a novel Al alloy film for display device, wherein the interconnection structure includes an Al alloy film and an oxide semiconductor layer of a thin film transistor connected to the Al alloy film in this order from the side of the substrate, which is capable of realizing low contact resistance even when the Al alloy film is electrically connected directly to the oxide semiconductor film while omitting a high melting point metal (barrier metal layer) such as Ti and Mo, and a display device provided with the subject interconnection structure.

Means for Solving the Problems

The invention encompasses the following embodiments.

(1) An interconnection structure including an interconnection film and a semiconductor layer of a thin film transistor above a substrate in this order from the side of a substrate, wherein
the semiconductor layer is composed of an oxide semiconductor.

(2) The interconnection structure according to (1), wherein the interconnection film is connected directly to a transparent conductive film constituting a pixel electrode on the same plane where the interconnection film is connected directly to the semiconductor layer.

(3) The interconnection structure according to (1) or (2), wherein the interconnection film is an Al alloy film containing at least one of Ni and Co and is connected directly to the semiconductor layer.

(4) The interconnection structure according to (3), wherein the Al alloy film contains at least one of Ni and Co in an amount of from 0.1 to 2 atomic %.

(5) The interconnection structure according to (3) or (4), wherein a part of at least one of Ni and Co is deposited and/or enriched at an interface between the Al alloy film and the semiconductor layer.

(6) The interconnection structure according to any one of (3) to (5), wherein the Al alloy film further contains at least one of Cu and Ge in an amount of from 0.05 to 2 atomic %.

(7) The interconnection structure according to any one of (3) to (6), wherein the Al alloy film further contains a rare earth element in an amount of from 0.05 to 1 atomic %.

(8). The interconnection structure according to any one of (3) to (7), wherein an irregularity having a maximum height roughness Rz of 5 nm or more is formed on a surface of the Al alloy film connected directly to the semiconductor layer.

(9) The interconnection structure according to (1) or (2), which includes an insulating film between the interconnection film and the substrate.

(10) The interconnection structure according to (9), wherein
the interconnection film is a Cu alloy film and has a laminated structure including
a first layer (Y) composed of a Cu alloy containing at least one element selected from the group consisting of Zn, Ni, Ti, Al, Mg, Ca, W, Nb, and Mn in an amount of from 2 to 20 atomic % in total; and
a second layer (X) composed of pure Cu or a Cu alloy containing Cu as a main component, which has an electrical resistivity lower than the first layer (Y),
wherein the first layer (Y) is connected directly to at least one of the substrate and the insulating film; and
the second layer (X) is connected directly to the semiconductor layer.

(11) The interconnection structure according to (10), wherein a film thickness of the first layer (Y) is 10 nm or more and 100 nm or less and is 60% or less of the whole film thickness of the Cu alloy film.

(12) The interconnection structure according to (10) or (11), wherein a part of Mn is deposited and/or enriched at an interface between at least one of the substrate and the insulating film, and the Cu alloy film.

(13) The interconnection structure according to (9), wherein the interconnection film is a Cu alloy film containing at least one element selected from the group consisting of Mn, Ni, Zn, Al, Ti, Mg, Ca, W, and Nb and is connected directly to both of at least one of the substrate and the insulating film, and the semiconductor layer.

(14) The interconnection structure according to (13), wherein the Cu alloy film contains at least one element selected from the group consisting of Mn, Ni, Zn, Al, Ti, Mg, Ca, W, and Nb in an amount of from 0.5 to 10 atomic %.

(15) The interconnection structure according to (13) or (14), wherein the Cu alloy film contains at least Mn in an amount of 0.5 atomic % or more and at least one element selected from the group consisting of B, Ag, C, W, Ca, and Mg in an amount of 0.3 atomic % or more.

(16) The interconnection structure according to any one of (13) to (15), wherein a part of Mn is deposited and/or enriched at an interface between at least one of the substrate and the insulating film and the Cu alloy film.

(17) The interconnection structure according to (9), wherein the interconnection film is a Cu film.

(18) The interconnection structure according to any one of (1) to (17), wherein the oxide semiconductor is composed of an oxide containing at least one element selected from the group consisting of In, Ga, Zn, Ti, and Sn.

(19) A display device including the interconnection structure according to any one of (1) to (18).

Advantage of the Invention

According to the invention, there could be provided an interconnection structure including an insulating film composed mainly of silicon oxide, silicon oxynitride or the like, a Cu alloy film, and an oxide semiconductor layer of a thin film transistor in this order from the side of the substrate, which has excellent adhesion even when the Cu alloy film is connected directly to the substrate and/or the insulating film, and is also capable of realizing low electrical resistance and low contact resistance with an oxide semiconductor layer and/or a transparent conductive film constituting a pixel electrode as characteristic features of a Cu based material. According to the invention, since a high melting point metal (barrier metal layer) such as Ti and Mo can be omitted, the problems which the conventional interconnection structure shown in FIG. 3 involve (such as a problem that the effective channel length is not determined) can be dissolved.

Also, since the interconnection structure of the invention is constituted as described above, low contact resistance between the Cu film and the oxide semiconductor layer formed thereon can be surely ensured with good reproducibility.

Also, according to the invention, there could be provided an interconnection structure including an Al alloy film and an oxide semiconductor layer of a thin film transistor connected to the Al alloy film in this order, which is capable of realizing low contact resistance even when the Al alloy film is connected directly to the oxide semiconductor layer. According to the invention, since a high melting point metal (barrier metal layer) such as Ti and Mo can be omitted, the problems which the interconnection structure shown in FIG. 5 involves (such as a problem that the effective channel length is not determined) can be dissolved.

EMBODIMENTS FOR CARRYING OUT THE INVENTION

Figure 1:
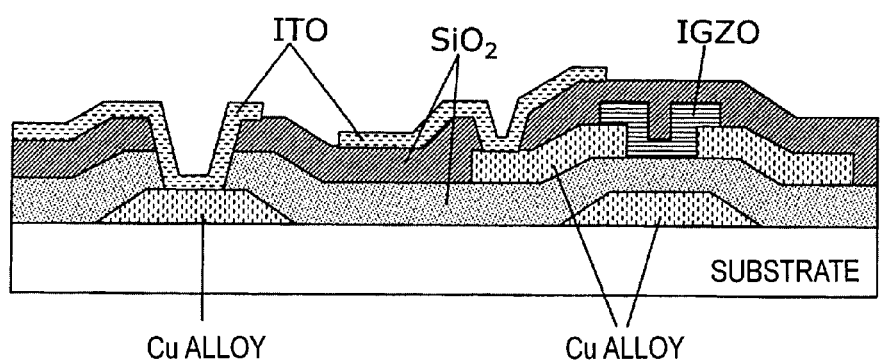
FIG. 1 is a schematic cross sectional explanatory view showing a representative interconnection structure of the invention.

The present inventors have found that the desired objects are achieved by the use of an interconnection structure including an interconnection film and a semiconductor layer of a thin film transistor above a substrate in this order from the side of the substrate, wherein the semiconductor layer is composed of an oxide semiconductor, and thus, the invention has been accomplished.

As a preferred first embodiment of the invention, examples thereof include an interconnection structure in which the interconnection film is an Al alloy containing at least one of Ni and Co, and is connected directly to the semiconductor layer. This is caused due to the fact that for the purpose of providing an interconnection structure including a novel Al alloy film for display device (the Al alloy film will be hereinafter sometimes referred to as "Al alloy film for direct contact") which is applicable to the structure shown in FIG. 4 (interconnection structure including an Al alloy film and an oxide semiconductor layer of a thin film transistor connected to the Al alloy film in this order from the side of the substrate) using an oxide semiconductor such as IGZO as a semiconductor layer of TFT, and which is able to realize low contact resistance even when the Al alloy film is connected directly to the oxide semiconductor layer while omitting a high melting point metal (barrier metal layer) such as Ti and Mo, the present inventors have made intensive investigations, and as a result, they have found that by using an Al alloy film containing Ni and/or Co, the desired object is achieved.

The Al alloy film is preferably connected directly to a transparent conductive film constituting a pixel electrode (representatively ITO, IZO, etc.) (see FIG. 4). Also, in order to achieve a more reduction of the contact resistance, an Al alloy film further containing Cu and/or Ge is suitably used, and in order to achieve an enhancement of the heat resistance, an Al alloy film further containing a rare earth element (representatively at least one member of Nd, La, and Gd) is suitably used. Also, in order to form a deposit or enriched layer of Ni and/or Co, each of which may be considered to contribute to realization of low contact resistance, it is preferable that the surface of the Al alloy film connected directly to the oxide semiconductor layer (furthermore, the surface of the Al alloy film connected directly to the transparent conductive film) has a maximum height roughness Rz of 5 nm or more. In order to obtain such a deposit or enriched layer of Ni and/or Co, it is effective to perform an appropriate combination of control of a substrate temperature during the deposition of an Al alloy (hereinafter sometimes referred to as "deposition temperature") (a heat treatment at about 200° C. or higher) and/or a heat treatment after the deposition of Al (a heat treatment at about 200° C. or higher), with a prescribed alkaline treatment. Examples thereof include: (I) a method in which after increasing the substrate temperature during the deposition to about 200° C. or higher to achieve the heat treatment and then performing the prescribed alkaline treatment, an oxide semiconductor film is deposited (in that case, the heat treatment after the deposition is not essential, and it may be or may not be performed); and (II) a method in which the heat treatment after the deposition of an Al alloy is performed at a temperature of about 200° C. or higher regardless of the substrate temperature (the substrate temperature may be room temperature without heating, or for example, heating at 200° C. or higher may be performed), the prescribed alkaline treatment is performed, and an oxide semiconductor film is then deposited.

Figure 4:
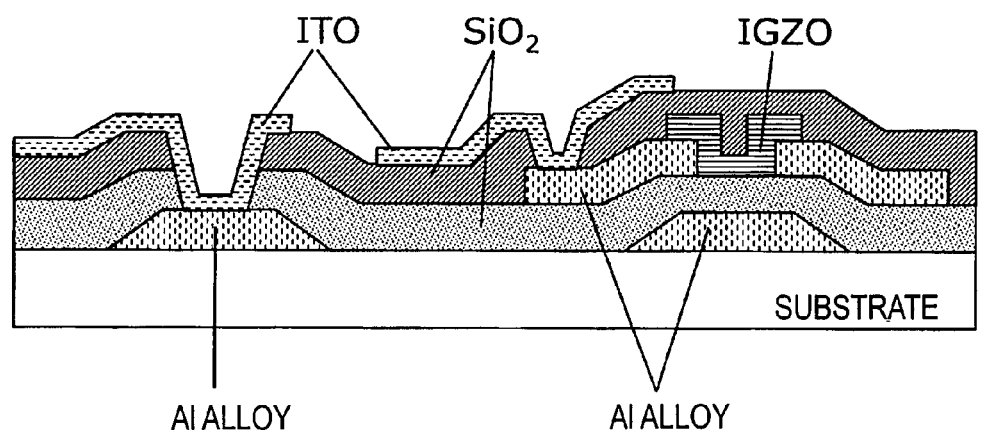
FIG. 4 is a schematic cross sectional explanatory view showing a representative interconnection structure of the invention.

The interconnection structure of the preferred first embodiment of the invention and a preferred embodiment of a manufacturing method thereof are hereunder described by reference to the above-described FIG. 4, but it should not be construed that the invention is limited thereto. While FIG. 4 illustrates an example of the bottom gate type, the invention is not limited thereto, but the top gate type is also encompassed. Also, in FIG. 4, while IGZO is used as a representative example of the oxide semiconductor layer, the invention is not limited thereto, but all of oxide semiconductors used for a display device such as a liquid crystal display device can be used.

The TFT substrate shown in FIG. 4 has an interconnection structure (bottom gate type) in which a gate electrode (an Al alloy in the drawing), a gate insulating film ($SiO_2$ in the drawing), a source electrode/drain electrode (an Al alloy in the drawing, details of which are described later), a channel layer (an oxide semiconductor layer, IGZO in the drawing), and a protective layer ($SiO_2$ in the drawing) are laminated in this order from the side of the substrate. Here, the protective layer of FIG. 4 may also be SiON, and similarly, the gate insulating film may also be SiON. This is because in the oxide semiconductor, its excellent properties are deteriorated under a reducing atmosphere, and therefore, the use of a silicon oxide film ($SiO_2$) or a silicon oxynitride film (SiON) capable of undergoing deposition under an oxidizing atmosphere is recommended. Alternatively, either the protective layer or the gate insulating film may be SiN.

Then, a characteristic feature of the preferred first embodiment of the invention resides in the use of an Al alloy containing Ni and/or Co as the foregoing Al alloy. By adding Ni and/or Co thereto, the contact electrical resistance (contact resistance) between the Al alloy film constituting the source electrode and/or the drain electrode and the oxide semiconductor layer can be reduced. That is, the foregoing Al alloy is extremely useful as an Al alloy for direct contact. Ni and Co may be contained alone, or both of them may be contained.

In order to sufficiently exhibit such effects, a content of the foregoing element(s) (when Ni or Co is contained alone, the content is an alone content, and in the case of containing the both, the content is a total content thereof) is, in general, preferably 0.10 atomic % or more. A reducing action of the contact resistance may be achieved so far as the content of the foregoing element(s) is a certain amount (because when the foregoing element(s) is added in a certain amount or more, the contact resistance is saturated), the content of the element(s) is more preferably 0.2 atomic % or more, and still more preferably 0.5 atomic % or more. On the other hand, when the content of the foregoing element(s) is too large, there is a concern that an electrical resistivity of the Al alloy film increases, and therefore, an upper limit thereof is preferably 2 atomic %, and more preferably 1 atomic %.

As the Al alloy film which is used in the preferred first embodiment of the invention, examples thereof include an Al alloy film containing Ni and/or Co in the foregoing content, with the remainder being Al and inevitable impurities.

In the foregoing Al alloy film, Cu and/or Ge can be contained in an amount of from 0.05 to 2 atomic %. These elements are an element capable of contributing to a more reduction of the contact resistance, and they may be added alone or in combination thereof. In order to sufficiently exhibit such effects, in general, a content of the foregoing element(s) (when Cu or Ge is contained alone, the content is an alone content, and in the case of containing the both, the content is a total content thereof) is preferably 0.05 atomic % or more. A reducing action of the contact resistance may be achieved so far as the content of the foregoing element(s) is a certain amount or more, the content of the element(s) is more preferably 0.1 atomic % or more, and still more preferably 0.2 atomic % or more. On the other hand, when the content of the foregoing element(s) is too large, there is a concern that an electrical resistivity of the Al alloy film increases, and therefore, an upper limit thereof is preferably 2 atomic %, and more preferably 1 atomic %.

The Al alloy film can further contain a rare earth element in an amount of from 0.05 to 1 atomic %. Such elements are an element useful for enhancing the heat resistance, and the rare earth elements may be contained alone or in combination of two or more kinds thereof. A content of the element (when the element is contained alone, the content is an alone content, and in the case of containing two or more kinds thereof, the content is a total content thereof) is preferably from 0.1 to 0.5 atomic %, and more preferably from 0.2 to 0.35 atomic %. The rare earth element as referred to herein means a group of elements including Sc (scandium) and Y (yttrium) in addition to lanthanoids (15 elements in total including from La having an atomic number of 57 to Lu having an atomic number of 71). Of these, the use of La, Nd, Y, Gd, Ce, Dy, Ti, or Ta is preferable; the use of La, Nd, or Gd is more preferable; and the use of La or Nd is still more preferable.

The content of the respective alloy elements in the foregoing Al alloy film can be determined by, for example, the ICP emission spectrometry (inductively coupled plasma emission spectrometry) method.

In the preferred first embodiment of the invention, at least the source electrode and/or the drain electrode may be composed of the foregoing Al alloy film, and a component composition of the other interconnection part (for example, the gate electrode) is not particularly limited. For example, in FIG. 4, the gate electrode, a scanning line (not shown), and a drain interconnection part (not shown) in a signal line may also be composed of the foregoing Al alloy film. In that case, all of the Al alloy interconnections in the TFT substrate can be formed of the same component composition.

As demonstrated in the Examples as described later, according to the invention, the contact resistance between the oxide semiconductor and the Al alloy film is suppressed to a low level. It may be considered that (I) a deposit containing Ni and/or Co, which is formed at an interface therebetween; and/or (II) an enriched layer containing Ni and/or Co deeply participate in this matter. In the case where the Al alloy film further contains Cu and/or Ge or a rare earth element, it may be considered that the deposit or enriched layer containing such an element is formed at the interface thereof. It may be considered that different from the Al oxide, such a deposit or enriched layer has high conductivity and is formed partially or entirely as a region having low electrical resistance at an interface between the oxide semiconductor and the Al alloy film, whereby the contact resistance is greatly reduced.

It is preferable to perform the foregoing deposition and/or enrichment of Ni and/or Co in combination with the prescribed heat treatment and the prescribed alkaline treatment. According to the heat treatment, Ni or the like contained in the Al alloy deposits on the surface, and according to the alkaline treatment, not only the deposit is exposed, but an oxidized film can be removed. In this way, by performing the both treatments, the contact resistance can be conspicuously reduced. As the alkaline treatment, representative examples thereof include a method of dipping in an about 0.4% by mass aqueous solution of TMAH (tetramethylammonium hydroxide) for about 60 seconds. Besides, a treatment with an acid and physical removal of the oxidized film by plasma irradiation can also be applied. Details of the alkaline treatment which is applicable to the preferred first embodiment of the invention are described in the explanatory part of Rz as described later.

Specifically, it is effective to perform the foregoing heat treatment in appropriate combination with the control of a substrate temperature (deposition temperature) during the deposition of an Al alloy film (a heat treatment at about 200° C. or higher) by the sputtering method and/or a heat treatment after the deposition of Al (a heat treatment at about 200° C. or higher). Details of the sputtering method are described later. In detail, examples thereof include (I) a method in which after increasing the substrate temperature to about 200° C. or higher to achieve the heat treatment, and then performing the prescribed alkaline treatment, and then, an oxide semiconductor film is deposited (in that case, the heat treatment after the deposition is not essential, and it may be or may not be performed); and (II) a method in which the heat treatment after the deposition of an Al alloy film is performed at a temperature of about 200° C. or higher regardless of the deposition temperature (the substrate may be room temperature without heating, or it may be heated at 200° C. or higher), the prescribed alkaline treatment is performed, and an oxide semiconductor film is then deposited. For the interconnection structure having an oxide semiconductor on the Al ally film as in the invention, it is recommended to adopt the foregoing heat treatment method (II) (in detail, a method in which the heat treatment is performed after the deposition without heating the substrate, and the alkaline treatment is then performed) rather than the foregoing (I). According to this, an increase of the contact resistance upon formation of a natural oxidized film such as alumina after the deposition of an Al alloy can be effectively prevented from occurring.

In any of the foregoing (I) and (II), a heat treatment time at 200° C. or higher is preferably 5 minutes or more and 60 minutes or less. Also, an upper limit of the substrate temperature of the foregoing (I) is preferably 250° C. On the other hand, the heating temperature after the deposition in the foregoing (II) is preferably 250° C. or higher. Taking heat-resistant temperature and hillock resistance of the base material into consideration, the heating temperature after the deposition in the foregoing (II) is preferably about 350° C. or lower.

The heat treatment which is performed after the deposition of the Al alloy film may be performed for the purpose of the foregoing deposition/enrichment, or the heat history after the formation of the Al alloy film (for example, a step of depositing an SiN film) may satisfy the foregoing temperature/time.

It is desirable that the Al alloy film is formed using a sputtering target (hereinafter sometimes referred to as "target") by the sputtering method. This is because a thin film having excellent film in-plane uniformity of the components or film thickness can be easily formed as compared with thin films formed by an ion plating method, an electron beam vapor deposition method, or a vacuum vapor deposition method. Also, when forming the Al alloy film by the sputtering method, an Al alloy film having a desired component composition can be formed without any concern of composition deviation by using an Al alloy sputtering target having the same composition as that in the foregoing Al—(Ni/Co) alloy (preferably one further containing Cu/Ge or a rare earth element), and such is suitable. The shape of the target includes those processed into an arbitrary shape (e.g., a square-shaped plate form, a circular plate form, a donut plate form, etc.) depending upon the shape or structure of a sputtering apparatus. Examples of a manufacturing method of the foregoing target include a method of obtaining a target by manufacturing an ingot composed of an Al-based alloy by a melt-forging method, a powder sintering method, or a spray foaming method; and a method of obtaining a target by manufacturing a preform composed of an Al-based alloy (intermediate before obtaining a final dense body) and then densifying the preform by means of densification.

Also, it is preferable that irregularities having a maximum height roughness Rz of 5 nm or more are formed on the surface of the Al alloy film connected directly to the oxide semiconductor layer. This is obtained by, prior to direct connection of the thus deposited Al alloy film to the oxide semiconductor layer, subjecting the surface of the Al alloy film to wet etching with an alkaline solution, or subjecting the surface of the Al alloy film to dry etching with a mixed gas of $SF_6$ and Ar. According to this, Al elutes, and Ni or Co as an alloying element nobler than Al is contained in an intermetallic compound to deposit on the surface of the Al alloy film and remains in an irregular state on the surface of the Al alloy. Then, when the maximum height roughness Rz of the irregularities is 5 nm or more, the contact resistance is reduced. The maximum height roughness Rz as referred to herein is in conformity with JIS B0601 (JIS standards after revision in 2001) (evaluation length: 4 mm).

When the foregoing irregularities are formed on the surface of the Al alloy film, even if the Al alloy is then brought into direct contact with the oxide semiconductor layer, a state where an oxide ($AlO_x$) which results in high contact electrical resistance is hardly formed is made. In some cases, a deposit containing an metal element nobler than Al comes into direct contact with the transparent conductive film. In view of the fact that such a state is realized, low electrical contact resistance in the oxide semiconductor layer and the Al alloy film can be realized. It is suitable that the maximum height roughness Rz is large. In general, the maximum height roughness Rz is preferably 8 nm or more, and more preferably 10 nm or more. Taking an enhancement of the manufacturing efficiency and maintenance of product quality such as prevention of disconnection of the transparent conductive film into consideration, in general, an upper limit of the maximum height roughness Rz is preferably 100 nm, and more preferably 50 nm.

When forming the foregoing irregularities on the Al alloy film, prior to the direct connection of the Al alloy film to the oxide semiconductor layer, the surface of the Al alloy film may be subjected to wet etching with an alkaline solution or dry etching. At that time, in order to realize 5 nm or more of a maximum height roughness Rz of the formed irregularities, an etching amount (etching depth) is preferably 5 nm or more. Also, such an etching treatment may be performed anytime before physically connecting the Al alloy film and the oxide semiconductor layer directly to each other. For example, the same effects are exhibited even before forming an interlaminar insulating film such as silicon nitride ($SiN_x$) or the like.

As the alkaline solution for performing the foregoing wet etching, examples thereof include an alkaline solution which has a pH of from about 9 to 13 (preferably a pH of from about 10.5 to 12.8) and elutes Al but does not elute a nobler metal element than Al. Specific examples thereof include an aqueous solution of a stripping solution having a pH of from about 9 to 13, "TOK106" (a trade name, manufactured by Tokyo Ohka Kogyo Co., Ltd.); an alkaline solution used in the Examples as described later (AZ 300MIF Developer, manufactured by AZ Electronic Materials); a developer stock solution containing TMAH (tetramethylammonium hydroxide) or a solution obtained by diluting the stock solution for the purpose of pH adjustment (pH: about 10.5 to 13.5); and a sodium hydroxide aqueous solution. The foregoing "TOK106" is a mixed solution of monoethanolamine and dimethyl sulfoxide (DMSO), and its pH range can be adjusted by a mixing ratio thereof. Preferred temperature and time of the wet etching may be appropriately determined depending upon a composition of the used alkaline solution or Al alloy, so as to obtain the desired maximum height roughness Rz. It is desirable that the wet etching is performed at from 30 to 70° C. for from 5 to 180 seconds (preferably at from 30 to 60° C. for from 10 to 120 seconds).

As the gas for performing the dry etching, a mixed gas of $SF_6$ and Ar (for example, $SF_6$: 60%, Ar: 40%) can be used. As the mixed gas when the silicon nitride film is formed, and this silicon nitride film is then subjected to dry etching, a mixed gas of $SF_6$, Ar, and $O_2$ is generally used. However, according to dry etching with such a mixed gas, the object of the invention cannot be achieved. A preferred condition of dry etching may be appropriately determined depending upon the kind of the used mixed gas or a composition of the used Al alloy, so as to obtain the desired maximum height roughness Rz.

By performing the etching treatment using the foregoing alkaline solution or mixed gas, a state where a deposit containing the foregoing metal elements are enriched on the surface of the Al alloy film is made.

The Al alloy film which is used in the invention may be preferably connected directly to the transparent conductive film such as ITO and IZO. In that case, similar to the above, it is preferable that irregularities having a maximum height roughness Rz of 5 nm or more are formed on the surface of the Al alloy film connected directly to the transparent conductive film. According to this, low contact resistance with the transparent conductive film is achieved. A preferred range of Rz and its controlling method may be performed in the same way as that described above.

In the light of the above, the Al alloy film most characterizing the preferred first embodiment of the invention has been described in detail.

In the preferred first embodiment of the invention, a characteristic feature resides in the foregoing Al alloy film, and other constituent features are not particularly limited.

As a preferred second embodiment of the invention, examples thereof include an interconnection structure in which an insulating film is included between the interconnection film and the substrate; and the interconnection film is a Cu alloy film and has a laminated structure including a first layer (Y) composed of a Cu alloy containing at least one element selected from the group consisting of Zn, Ni, Ti, Al, Mg, Ca, W, Nb, and Mn in an amount of from 2 to 20 atomic % in total and a second layer (X) composed of pure Cu or a Cu alloy containing Cu as a main component, which has an electrical resistivity lower than the first layer (Y), wherein the first layer (Y) is connected directly to at least one of the substrate and the insulating film, and the second layer (X) is connected directly to the semiconductor layer. This is caused due to the fact that for the purpose of providing an interconnection structure including a novel Cu alloy film for display device (the Cu alloy film will be hereinafter sometimes referred to as "Cu alloy film for direct contact") which is applicable to the structure shown in FIG. 1 (interconnection structure including an insulating film, a Cu alloy film, and an oxide semiconductor layer of a thin film transistor in this order from the side of the substrate) using an oxide semiconductor such as IGZO as a semiconductor layer of TFT; which is excellent in adhesion thereto and low in electrical resistance of the film itself, and is suppressed in contact resistance to the oxide semiconductor layer or the transparent conductive film constituting a pixel electrode, even when the Cu alloy film is electrically connected directly to the substrate and/or the insulating film while omitting a high melting point metal (barrier metal layer) such as Ti and Mo, the present inventors have made intensive investigations, and as a result, they have found that the desired object is achieved by using, as the Cu alloy film to be used for the interconnection structure, a Cu alloy having a laminated structure including a first layer (Y) composed of a Cu alloy containing at least one element selected from the group consisting of Zn, Ni, Ti, Al, Mg, Ca, W, Nb, and Mn in an amount of from 2 to 20 atomic % in total; and a second layer (X) composed of pure Cu or a Cu alloy containing Cu as a main component, which has an electrical resistivity lower than the first layer (Y), wherein the first layer (Y) is connected directly to the substrate and/or the insulating film, and the second layer (X) is connected directly to the semiconductor layer.

The Cu alloy film is preferably connected directly to a transparent conductive film (representatively ITO, IZO, etc.) constituting a pixel electrode (see FIG. 1). Also, not only a film thickness of the first layer (Y) constituting the above-laminated Cu alloy film is preferably 10 nm or more and 100 nm or less, but it is 60% or less of the whole film thickness of the Cu alloy film. Also, a preferred alloy element which is contained in the first layer (Y) is Mn, which is very excellent in adhesion to the insulating film. It may be considered that this is caused due to the matter that a Cu—Mn reaction layer in which a part of Mn is deposited and/or is enriched is formed at an interface with the insulating layer. It is preferable that the laminated Cu alloy film having such excellent adhesion is formed by depositing the Cu alloy film and then performing a heat treatment at a temperature of about 250° C. or higher for 30 minutes or more. However, from the viewpoint of surely ensuring the low contact resistance between the Cu alloy film and the oxide semiconductor layer with good reproducibility, in general, it is effective to perform the heat treatment after the deposition of the Cu alloy film while controlling at a temperature within the range of higher than about 300° C. and up to about 500° C. It has become clear that when the heat treatment is performed at a temperature of 300° C. or lower, scattering in the contact resistance with the oxide semiconductor layer is caused (see Examples 2-2 as described later).

Preferred embodiments of the interconnection structure of the invention and a manufacturing method thereof are hereunder described by reference to the above-described FIG. 1, but it should not be construed that the invention is limited thereto. While FIG. 1 illustrates an example of the bottom gate type, the invention is not limited thereto, but the top gate type is also encompassed. Also, in FIG. 1, while IGZO is used as a representative example of the oxide semiconductor layer, the invention is not limited thereto, but all of oxide semiconductors used for a display device such as a liquid crystal display device can be used.

The TFT substrate shown in FIG. 1 has an interconnection structure (bottom gate type) in which a gate electrode (Cu alloy in the drawing), a gate insulating film ($SiO_2$ in the drawing), a source electrode/drain electrode (Cu alloy in the drawing, details of which are described later), a channel layer (an oxide semiconductor layer, IGZO in the drawing), and a protective layer ($SiO_2$ in the drawing) are laminated in this order from the side of the substrate. Here, the protective layer of FIG. 1 may also be silicon oxynitride, and similarly, the gate insulating film may also be silicon oxynitride. As described above, this is because in the oxide semiconductor, its excellent properties are lost under a reducing atmosphere, and therefore, the use of silicon oxide (silicon oxynitride) capable of undergoing deposition under an oxidizing atmosphere is recommended. Alternatively, either the protective layer or the gate insulating film may be silicon nitride.

Then, a characteristic feature of the preferred second embodiment of the invention resides in the use of the above-laminated Cu alloy as the foregoing Cu alloy. In the invention, the first layer (Y) which is connected directly to the substrate and/or the insulating film is composed of a Cu alloy containing an alloying element which contributes to an enhancement of the adhesion, whereby the adhesion to the substrate and/or the insulating film is enhanced. On the other hand, the second layer (X) which is laminated on the first layer (Y) is connected directly to the oxide semiconductor layer and is composed of an element having a low electrical resistivity (pure Cu or a Cu alloy having the same low electrical resistivity as pure Cu), thereby contriving to reduce the electrical resistivity of the whole of the Cu alloy film. That is, by taking the foregoing laminated structure as specified in the preferred second embodiment of the invention, not only (I) original properties of Cu that the electrical resistivity is low as compared with Al; and that the contact resistance with the oxide semiconductor layer and/or the transparent conductive film constituting a pixel electrode is suppressed in a low level are effectively exhibited at a maximum, but (II) the low adhesion to the substrate and/or the insulating film, which is a drawback of Cu, is conspicuously increased. That is, the Cu alloy is extremely useful as a Cu alloy for direct contact and in particular, is suitably used as an interconnection material of a source electrode and/or a drain electrode.

In the preferred second embodiment of the invention, the second layer (X) is formed above (right above) the first layer (Y) and is composed of pure Cu or a Cu alloy containing Cu as a main component, which has an electrical resistivity lower than the first layer (Y). By providing such second layer (Y), the electrical resistivity of the whole of the Cu alloy film can be suppressed in a low level. Here, as for the "Cu alloy having an electrical resistivity lower than the first layer (Y)" which is used for the second layer (X), the kind and/or the content of the alloying element may be appropriately controlled so as to have an electrical resistivity lower than the first layer (Y) composed of a Cu alloy containing an adhesion enhancing element. The element having a low electrical resistivity (in general, an element having a low electrical resistivity comparable to the pure Cu alloy) can be easily chosen among known elements while referring to numerical values described in documents, or the like. However, even in the case of an element having a high electrical resistivity, it is able to reduce the electrical resistivity by making its content low (in general, from about 0.05 to 1 atomic %), and therefore, the foregoing alloying element which can be applied to the second layer (X) is not always limited to elements having a low electrical resistivity. Specifically, for example, Cu-0.5 at % Ni, Cu-0.5 at % Zn, Cu-0.3 at % Mn, and the like are suitably used. Also, the foregoing alloying element which can be applied to the second layer (X) may contain a gas component such as an oxygen gas and a nitrogen gas, and for example, Cu—O, Cu—N, or the like can be used.

The first layer (Y) most characterizing the preferred second embodiment of the invention is hereunder described in detail. The "substrate and/or insulating film" is hereunder sometimes called "substrate or the like" for the sake of convenience.

[First Layer (Y)]

In the foregoing Cu alloy film, the first layer (Y) is connected directly to the substrate and/or the insulating film and is composed of a Cu alloy containing at least one element (adhesion enhancing element) selected from the group consisting of Zn, Ni, Ti, Al, Mg, Ca, W, Nb, and Mn in an amount of from 2 to 20 atomic % in total. These elements may be contained alone or in combination of two or more kinds thereof. In the case of containing such an element alone, the alone amount may satisfy the foregoing range, and in the case of containing two or more kinds of these element, the total amount may satisfy the foregoing range. Such an element is chosen as an element which dissolves in solid in the Cu metal but does not dissolve in solid in the Cu oxidized film. It may be considered that when the Cu alloy in which such an element dissolves in solid is oxidized by the heat treatment of the deposition process or the like, the foregoing element does not dissolve in solid in the Cu oxidized film, and therefore, the foregoing element is swept out under an interface of the Cu oxidized film formed by oxidation and becomes enriched, and the adhesion to the substrate and/or the insulating film is enhanced by the enriched layer. By the formation of such an enriched layer, even when the Cu alloy film is connected directly to the substrate or the like without intervening the barrier metal, sufficient adhesion can be ensured. As a result, the deterioration of display performance such as gradation display of a liquid crystal display can be prevented from occurring. The enriched layer as referred to herein is a layer in which the foregoing adhesion enhancing element is present in a high concentration, and specifically a layer in which the foregoing adhesion enhancing element is present in a concentration of 1.1 times or more as compared with the concentration in a matrix of the first layer (Y).

Figure 6:
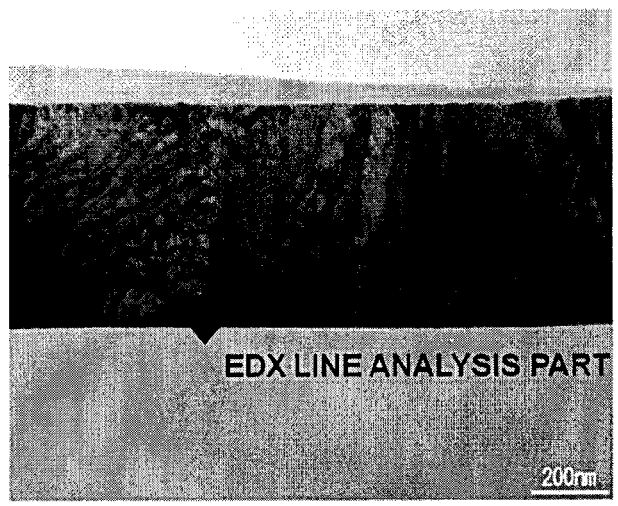
FIG. 6 is a cross sectional TEM image in the vicinity of an interface between a Cu alloy film and a glass substrate.
Figure 7:
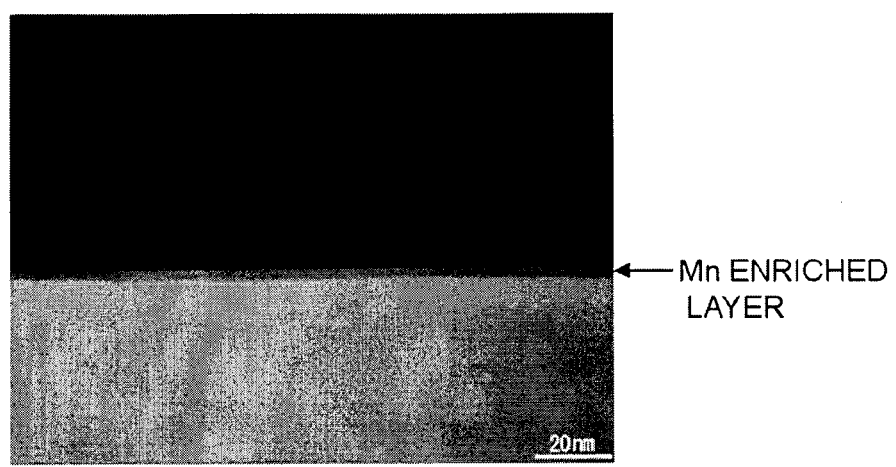
FIG. 7 is an enlarged image of a part of FIG. 6.
Figure 8:
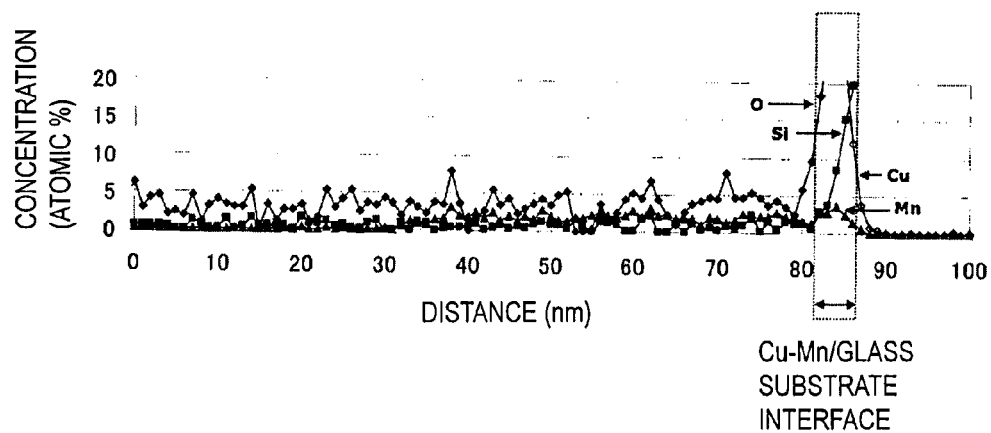
FIG. 8 is a graph showing results obtained by EDX line analysis from a cross sectional TEM image.

FIGS. 6 and 7 are each a TEM image (magnification: 150,000 times) in the vicinity of an interface between a Cu alloy film (4 at % Mn—Cu alloy, film thickness: 50 nm) and a glass substrate (FIG. 7 is an enlarged image of a part of FIG. 6, magnification: 1,500,000 times); and FIG. 8 is a graph showing results obtained by EDX line analysis of the cross sectional TEM image. It is also shown from FIG. 8 that the enriched layer is formed at the interface between the Cu alloy film and the glass substrate.

Of the foregoing adhesion enhancing elements, Mn and Ni are preferable, and Mn is more preferable. This is because Mn is an element in which an enrichment phenomenon at the foregoing interface is every strongly revealed. That is, Mn moves from the inside of the film toward the outside of the film (an interface with the insulating layer, or the like) due to the heat treatment during or after the deposition of a Cu alloy (for example, including a heat history in the manufacturing process of a display device, such as a step of depositing an insulating film of an $SiO_2$ film). The movement of Mn to the interface is much more accelerated due to a driving force by the Mn oxide formed through oxidation by the heat treatment. As a result, it may be considered that a reaction layer of Cu—Mn (hereafter referred to as "Mn reaction layer") is entirely formed with good adhesion at the interface with the insulating film, whereby the adhesion to the insulating film is conspicuously enhanced.

The foregoing enriched layer (also including a deposit) such as the Mn reaction layer is preferably obtained by depositing a Cu alloy by the sputtering method (the detailed thereof will be described below) and then performing a prescribed heat treatment. As for the terms "performing a prescribed heat treatment" as referred to herein, so far as the adhesion is taken into consideration as described above, it is meant to perform a heat treatment at about 250° C. or higher for 30 minutes or more; and furthermore, from the viewpoint of surely ensuring the low resistance to the oxide semiconductor layer with good reproducibility, it is meant to control the temperature range of the heat treatment especially at higher than about 300° C. and 500° C. or lower. According to such a heat treatment, the alloying element is diffused into the interface with the insulating film and becomes easily enriched. Thereafter, an oxide semiconductor film may be deposited.

The foregoing heat treatment may be performed for the purpose of forming the enriched layer such as the Mn reaction layer of the like, or may be one in which a heat history after depositing the Cu alloy film (for example, a step of depositing a protective film such as a silicon nitride film) satisfies the foregoing temperature/time.

A content of the foregoing element is preferably 2 atomic % or more and 20 atomic % or less. When the content of the foregoing element is less than 2 atomic %, the adhesion to the transparent substrate is insufficient, so that there is a concern that satisfactory properties are not obtained. For example, when the content of the foregoing element is small as about 0.5%, though there may be the case where good adhesion is obtained depending upon the condition, there is a concern that the reproducibility fails. Then, in the invention, taking also the reproducibility into consideration, a lower limit of the content of the foregoing element is set to 2 atomic % or more. According to this, good adhesion is always obtained regardless of the measurement condition or the like. On the other hand, when the content of the foregoing element exceeds 20 atomic %, not only the electrical resistivity of the Cu alloy film (interconnection film) itself (first layer+second layer) becomes high, but the residue is generated during etching the interconnection, and therefore, there is a concern that it is difficult to perform micromachining. A lower limit of the content of the foregoing element is preferably 3 atomic %, and more preferably 4 atomic %. Also, an upper limit thereof is preferably 12 atomic %, more preferably 10 atomic %, and still more preferably 4.0 atomic % (especially 3.5 atomic %).

Strictly, the preferred content of the foregoing element may vary depending upon the kind of the element. This is because loads (influences) against the adhesion and the electrical resistance vary depending upon the kind of the element. For example, the content of Mn is preferably 3 atomic % or more and 12 atomic % or less, and more preferably 4 atomic % or more and 10 atomic % or less.

The Cu alloy film which is used in the preferred second embodiment of the invention contains the foregoing element, with the remainder being Cu and inevitable impurities.

The Cu alloy constituting the first layer (Y) may further contain Fe and/or Co in an amount of from 0.02 to 1.0 atomic % in total (when Fe or Co is contained alone, the content is an alone content). According to this, the low electrical resistivity and the high adhesion to the transparent substrate are more enhanced. The content is preferably 0.05 atomic % or more and 0.8 atomic % or less, and more preferably 0.1 atomic % or more and 0.5 atomic % or less.

In the Cu alloy film, the second layer (X) is formed above (right above) the first layer (Y) and is composed of pure Cu or a Cu alloy containing Cu as a main component, which has an electrical resistivity lower than the first layer (Y). By providing such second layer (X), the electrical resistivity of the whole of the Cu alloy film can be suppressed in a low level.

The Cu alloy containing Cu as a main component means that Cu is contained in the largest amount in the Cu alloy.

In this way, in the Cu alloy film which is used in the invention, desired properties are exhibited by taking a laminated structure of the second layer (X) and the first layer (Y) having a different composition from each other. In order to exhibit these properties more effectively, in particular, it is effective to control a film thickness of the first layer (Y). Specifically, the film thickness of the first layer (Y) is preferably 10 nm or more, and it is preferably 60% or less relative to the whole film thickness of the Cu alloy film [total film thickness of the second layer (X) and the first layer (Y)]. According to this, not only low electrical resistivity and high adhesion are obtained, but micromachining properties are more effectively exhibited. More preferably, the film thickness of the first layer (Y) is 20 nm or more, and it is 50% or less relative to the whole film thickness of the Cu alloy film.

An upper limit of the film thickness of the first layer (Y) may be properly determined while taking mainly the electrical resistivity of the interconnection film itself into consideration, and it is preferably 100 nm or less, and more preferably 80 nm or less. Also, though a lower limit of the ratio of the first layer (Y) to the whole film thickness of the Cu alloy film is not particularly limited, when an enhancement of adhesion to the transparent substrate is taken into consideration, in general, it is preferably 15%.

Strictly, the film thickness of the first layer (Y) may vary depending upon the kind of the element contained in the first layer (Y). This is because the influences against the adhesion and the electrical resistance vary depending upon the kind of the element. For example, in the case of Mn, a lower limit of the film thickness is preferably 10 nm or more, and more preferably 20 nm or more. Also, in the case of Mn, an upper limit of the film thickness is preferably 80 nm or less, and more preferably 50 nm or less. Also, in the case of Ni or Zn, a lower limit of the film thickness is preferably 20 nm or more, and more preferably 30 nm or more; and an upper limit thereof is preferably 100 nm or less, and more preferably 80 nm or less.

In general, a film thickness of the whole of the Cu alloy film (second layer (X)+first layer (Y)) is preferably 200 nm or more and 500 nm or less, and more preferably 250 nm or more and 400 nm or less.

For the purpose of more enhancing the adhesion to the substrate or the like, the first layer (Y) may further contain oxygen. It may be considered that by introducing an appropriate amount of oxygen into the first layer (Y) coming into contact with the substrate and/or the insulating film, an oxygen-containing layer containing a prescribed amount of oxygen is intervened at an interface thereof, and a strong bond (chemical bond) is formed therebetween, whereby the adhesion is enhanced.

In order to sufficiently exhibit the foregoing actions, an amount of oxygen contained in the first layer (Y) is preferably 0.5 atomic % or more, more preferably 1 atomic % or more, still more preferably 2 atomic % or more, and yet still more preferably 4 atomic % or more. On the other hand, when the amount of oxygen is too large, and the adhesion is excessively enhanced, the residue remains after performing wet etching, and wet etching properties are lowered. Also, when the amount of oxygen is too large, the electrical resistance of the whole of the Cu alloy film is enhanced. Taking these viewpoints into consideration, the amount of oxygen contained in the first layer (Y) is preferably 30 atomic % or less, more preferably 20 atomic % or less, still more preferably 15 atomic % or less, and yet still preferably 10 atomic % or less.

Such oxygen-containing first layer (Y) is obtained by supplying an oxygen gas during the deposition of the first layer (Y) by the sputtering method. As an oxygen gas supply source, in addition to oxygen ($O_2$), an oxygen atom-containing oxidizing gas (for example, $O_3$, etc.) can be used. Specifically, during depositing the first layer (Y), a mixed gas in which oxygen is added to a process gas which is usually used in the sputtering method is used; and during depositing the second layer (X), the sputtering may be performed using a process gas without adding oxygen thereto. This is because from the viewpoint of reducing the electrical resistivity, it is preferable that the second layer (X) does not contain oxygen.

Representative examples of the process gas include rare gases (for example, a xenon gas or an argon gas), and an argon gas is preferable. Also, by changing the amount of the oxygen gas in the process gas during depositing the first layer (Y), plural undercoat layers having a different content of oxygen from each other can be formed.

Since the amount of oxygen in the first layer (Y) may vary depending upon a mixing ratio of the oxygen gas occupying in the process gas, the mixing ratio may be appropriately varied according to the amount of oxygen which is intended to introduce. For example, in the case where it is intended to introduce 1 atomic % of oxygen into the first layer (Y), in general, it is preferable to mix oxygen in an amount of about 10 times, thereby regulating the ratio of the oxygen gas occupying in the process gas to about 10% by volume.

The Cu alloy film which is used in the preferred second embodiment of the invention is excellent in adhesion to the substrate and/or the insulating film, and therefore, it is suitably used as the interconnection film and the film for electrode which come into direct contact therewith. In the invention, the source electrode and/or the drain electrode is preferably composed of the Cu alloy film, and the component composition of other interconnection part (for example, the gate electrode) is not particularly limited. For example, in FIG. 1, the gate electrode, a scanning line (not shown), and a drain interconnection part (not shown) in a signal line may also be composed of the foregoing Cu alloy film. In that case, all of the Cu alloy interconnections in the TFT substrate can be formed of the same component composition.

It is preferable that the Cu alloy film composed of the foregoing laminated structure is formed by the sputtering method. Specifically, the laminated structure may be formed by depositing materials constituting the first layer (Y) by the sputtering method to form the first layer (Y) and then depositing materials constituting the second layer (X) thereon by the sputtering method to form the second layer (X). It is preferable from the viewpoint of coverage that after forming the Cu alloy laminated film in this way and then applying prescribed patterning, the cross sectional shape is processed into a taper form having a taper angle of preferably from about 45 to 60°.

By adopting the sputtering method, a Cu alloy film having substantially the same composition as the sputtering target can be deposited. Then, by adjusting the composition of the sputtering target, the composition of the Cu alloy film can be adjusted. The composition of the sputtering target may be adjusted using a Cu alloy target having a different composition, or it may be adjusted by chipping a metal of the alloying element on a pure Cu target.

According to the sputtering method, a slight divergence is possibly generated between a composition of the deposited Cu alloy film and a composition of the sputtering target. But, such a divergence is in general within several atomic %. Then, by controlling the composition of the sputtering target within the range of ±10 atomic % at maximum, a Cu alloy film having a desired composition can be deposited.

In the light of the above, the Cu alloy film most characterizing the preferred second embodiment of the invention has been described in detail.

In the preferred second embodiment of the invention, a characteristic feature resides in the foregoing Cu alloy film, and the other constituent features are not particularly limited.

As a preferred third embodiment of the invention, examples thereof include an interconnection structure in which an insulating film is included between the interconnection film and the substrate; and the interconnection film is a Cu alloy film containing at least one element selected from the group consisting of Mn, Ni, Zn, Al, Ti, Mg, Ca, W, and Nb and is connected directly to the semiconductor layer as well as at least one of the substrate and the insulating film. This is caused due to the fact that for the purpose of providing an interconnection structure including a novel Cu alloy film for display device (the Cu alloy film will be hereinafter sometimes referred to as "Cu alloy film for direct contact") which is applicable to the structure shown in FIG. 1 (interconnection structure including an insulating film, a Cu alloy film, and an oxide semiconductor layer of a thin film transistor in this order from the side of the substrate) using an oxide semiconductor such as IGZO as a semiconductor layer of TFT, and which is excellent in adhesion thereto and low in electrical resistance of the film itself, and is suppressed in contact resistance to the oxide semiconductor layer or the transparent conductive film constituting a pixel electrode, even when the Cu alloy film is electrically connected directly to the substrate and/or the insulating film while omitting a high melting point metal (barrier metal layer) such as Ti and Mo, the present inventors have made intensive investigations, and as a result, they have found that the desired object is achieved by using, as the Cu alloy film to be used for the interconnection structure, (I) a Cu—X1 alloy film containing at least one element selected from the group consisting of Mn, Ni, Zn, Al, Ti, Mg, Ca, W, and Nb (hereafter called "adhesion enhancing element" and sometimes represented by "X1"), or preferably (II) a Cu—X1-X2 alloy film containing Mn as the adhesion enhancing element and further containing at least one element selected from the group consisting of B, Ag, C, W, Ca, and Mg (hereinafter sometimes represented by "X2"). It is preferable that the Cu alloy film is electrically connected directly to the semiconductor layer as well as the substrate and/or the insulating film.

The Cu alloy film is preferably connected directly to a transparent conductive film (representatively ITO, IZO, etc.) constituting a pixel electrode (see FIG. 1). Also, in general, a preferred content of the adhesion enhancing element is from 0.5 to 10 atomic %, and in particular, in the case of containing Mn, it is very excellent in adhesion to the substrate and/or the insulating film. It may be considered that this is caused due to the matter that a Cu—Mn reaction layer in which a part of Mn is deposited and/or enriched is formed at an interface with the substrate and/or the insulating layer. It is preferable that the Cu alloy film having such excellent adhesion is formed by depositing the Cu alloy film and then performing a heat treatment at a temperature of about 250° C. or higher for 5 minutes or more.

Preferred embodiments of the interconnection structure of the invention and a manufacturing method thereof are hereunder described by reference to the above-described FIG. 1, but it should not be construed that the invention is limited thereto. While FIG. 1 illustrates an example of the bottom gate type, the invention is not limited thereto, but the top gate type is also encompassed. Also, in FIG. 1, while IGZO is used as a representative example of the oxide semiconductor layer, the invention is not limited thereto, but all of oxide semiconductors used for a display device such as a liquid crystal display device can be used.

The TFT substrate shown in FIG. 1 has an interconnection structure (bottom gate type) in which a gate electrode (Cu alloy in the drawing), a gate insulating film ($SiO_2$ in the drawing), a source electrode/drain electrode (Cu alloy in the drawing, details of which are described later), a channel layer (an oxide semiconductor layer, IGZO in the drawing), and a protective layer ($SiO_2$ in the drawing) are laminated in this order from the side of the substrate. Here, the protective layer of FIG. 1 may also be SiON, and similarly, the gate insulating film may also be SiON. As described above, this is because in the oxide semiconductor, its excellent properties are lost under a reducing atmosphere, and therefore, the use of $SiO_2$ (SiON) capable of undergoing deposition under an oxidizing atmosphere is recommended. Alternatively, either the protective layer or the gate insulating film may be SiN.

(Cu—X1 Alloy Film)

A characteristic feature of the preferred third embodiment of the invention resides in the use of the adhesion enhancing element X1, namely a Cu—X1 alloy containing at least one element selected from the group consisting of Mn, Ni, Zn, Al, Ti, Mg, Ca, W, and Nb. Such an adhesion enhancing element X1 may be contained alone or in combination of two or more kinds thereof. Such an adhesion enhancing element X1 is chosen as an element which dissolves in solid in the Cu metal but does not dissolve in solid in the Cu oxidized film. Alternatively, the adhesion enhancing element X1 may be an element capable of easily forming a chemical bond to an element constituting the substrate such as a glass substrate or an element constituting the insulating film (for example, $SiO_2$) (specifically chemical adsorption or forming an interface reaction layer). It may be considered that when the Cu alloy in which such an element dissolves in solid is oxidized by a heat treatment in the deposition process, or the like, the foregoing element is diffused and enriched at a grain boundary or interface, and the adhesion to the substrate and/or the insulating film is enhanced by the enriched layer. As a result, even when the Cu alloy film is connected directly to the substrate or the like without intervening a barrier metal, sufficient adhesion can be ensured, and the deterioration of display performance such as gradation display of a liquid crystal display can be prevented from occurring. The enriched layer as referred to herein is a layer in which the foregoing adhesion enhancing element is present in a high concentration, and specifically a layer in which the foregoing adhesion enhancing element is present in a concentration of 1.1 times or more as compared with the concentration in a matrix of the Cu alloy film.

As described above, FIGS. 6 and 7 are each a TEM image (magnification: 150,000 times) in the vicinity of an interface between a Cu alloy film (4 at % Mn—Cu alloy, film thickness: 50 nm) and a glass substrate (FIG. 7 is an enlarged image of a part of FIG. 6, magnification: 1,500,000 times); and FIG. 8 is a graph showing results obtained by EDX line analysis of the cross sectional TEM image. It is also shown from FIG. 8 that the enriched layer is formed at the interface between the Cu alloy film and the glass substrate.

The adhesion enhancing element X1 is preferably Mn, Ni, Ti, Al, or Mg, more preferably Mn or Ni, and still more preferably Mn.

With respect to the foregoing element, an assumed mechanism of enhancing the adhesion is described as follows. First of all, it may be considered that Mn is an element in which an enrichment phenomenon at the foregoing interface is every strongly revealed. That is, Mn moves from the inside of the film toward the outside of the film (an interface with the insulating layer, or the like) due to the heat treatment during or after the deposition of a Cu alloy (for example, including a heat history in the manufacturing process of a display device, such as a step of depositing an insulating film of an $SiO_2$ film). The movement of Mn to the interface is much more accelerated due to a driving force by the Mn oxide formed through oxidation by the heat treatment. As a result, it may be considered that a reaction layer of Cu—Mn (hereafter referred to as "Mn reaction layer") is partially or entirely formed with good adhesion at the interface with the insulating film, whereby the adhesion to the insulating film is conspicuously enhanced.

The foregoing enriched layer (also including a deposit) such as the Mn reaction layer is preferably obtained by depositing a Cu alloy by the sputtering method (the detailed thereof will be described below) and then performing a heat treatment at about 250° C. or higher for 5 minutes or more. According to such a heat treatment, the alloying element is diffused into the interface with the insulating film and becomes easily enriched. Thereafter, an oxide semiconductor film may be deposited.

The foregoing heat treatment may be performed for the purpose of forming the enriched layer such as the Mn reaction layer of the like, or may be one in which a heat history after depositing the Cu alloy film (for example, a step of depositing a protective film such as a SiN film) satisfies the foregoing temperature/time.

On the other hand, it may be considered that any of Ti, Al, or Mg is an element capable of causing a reaction with $SiO_2$ as a main component of the glass substrate to form a compound. Specifically, it may be considered that each of Al and Mg reacts with $SiO_2$ in a system at a temperature of from 20 to 300° C. at a pressure of 1 atm, thereby forming a composite oxide of Si—Al—O and Si—Mg—O, respectively. Also, it may be considered that Ti reacts with $SiO_2$ in a system at a temperature of from 20 to 300° C. at a pressure of 1 atm, thereby forming an oxide of TiSi or $TiSi_2$.

It may be considered that in the foregoing element such as Ti, a diffusion coefficient in Cu is larger than a self-diffusion coefficient of Cu, and therefore, even when contained in a small amount, such an element is diffused and enriched at the interface with the glass substrate by heating after the deposition and reacts with $SiO_2$ at the interface to form a chemical bond, thereby tremendously enhancing the adhesion to the glass substrate.

A content of the foregoing adhesion enhancing element X1 (when the element is contained alone, the content is an alone content, and when two or more kinds thereof are contained, the content is a total content thereof) is preferably 0.5 atomic % or more. When the content of the foregoing element is less than 0.5 atomic %, there is a concern that the adhesion to the substrate and/or the insulating film is insufficient, so that satisfactory properties are not obtained. For example, when the content of the foregoing element is small as about 0.5%, though there may be the case where good adhesion is obtained depending upon the condition, there is a concern that the reproducibility fails. Then, in the preferred third embodiment of the invention, taking also the reproducibility into consideration, a preferred lower limit of the content of the foregoing element is set to 0.5 atomic %. According to this, good adhesion is always obtained regardless of the measurement condition or the like. When an enhancement in adhesion to the substrate or the like is taken into consideration, it is suitable that the content of the foregoing adhesion enhancing element is large. However, when the content of the foregoing element exceeds 10 atomic %, the electrical resistivity of the Cu alloy film (interconnection film) itself is high. In addition, when the addition amount further increases, the residue is generated during etching of an interconnection. Therefore, there is a concern that it is difficult to perform micromachining. A preferred content of the foregoing element is 1 atomic % or more and 3 atomic % or less, and more preferably 1 atomic % or more and 2 atomic % or less.

The content of each of the alloying elements in the Cu alloy film can be determined by, for example, the ICP emission spectrometry (inductively coupled plasma emission spectrometry) method.

As described above, by subjecting the foregoing Cu—X1-containing alloy film to a heat treatment after the deposition, a remarkably excellent adhesive strength is obtained. It may be conjectured that this is caused due to the matter that the enrichment of the alloying element (X1) at the interface with the glass substrate and the formation of a chemical bond at the interface are accelerated by the heat treatment (heat energy) after the deposition.

The higher the temperature is, and the longer the holding time is, the more effective the condition of the heat treatment affects an enhancement of the adhesion. But, it is necessary that the heat treatment temperature is not higher than the heat-resistant temperature of the glass substrate; and when the holding time is excessively long, a lowering of productivity of a display device (e.g., a liquid crystal display, etc.) is caused. Accordingly, in general, it is preferable to allow the condition of the heat treatment to fall within the range that the temperature is from 250 to 450° C., and the holding time is from 30 to 120 minutes. Since this heat treatment also affects effectively a reduction of the electrical resistivity of the Cu—X-containing alloy film, it is preferable from the viewpoint of realizing low electrical resistance.

The heat treatment may be a heat treatment to be performed for the purpose of more enhancing the adhesion, or it may be one in which the heat history after the formation of the foregoing Cu—X1 alloy film satisfies the foregoing temperature/time.

The Cu—X1 alloy film which is used in the preferred third embodiment of the invention contains the foregoing element, with the remainder being Cu and inevitable impurities.

(Cu—X1-X2 Alloy Film)

The Cu alloy film which is used in the preferred third embodiment of the invention may further contain, in addition to the foregoing adhesion enhancing element X1, at least one element X2 selected from the group consisting of B, Ag, C, W, Ca, and Mg. The foregoing element X2 is an element which contributes to a more enhancement of the adhesion to the substrate or the like or a reduction of the electrical resistivity of the Cu alloy film itself. The foregoing element X2 is preferably B, Ag, Mg, or Ca, and more preferably B or Ag.

In particular, the action of the foregoing element X2 is conspicuously exhibited in the case of containing 0.5 atomic % or more of Mn as the adhesion enhancing element X1. In that case, a content of the foregoing element X2 (alone content or total content) is preferably 0.3 atomic or more, and more preferably 0.5 atomic % or more. However, even when the element X2 is excessively added, the foregoing action is saturated, and reversely, there is a concern that the electrical resistivity increases. Therefore, an upper limit of the content of the foregoing element X2 is preferably 5 atomic %, and more preferably 2 atomic %.

It is preferable that the Cu alloy film which is used in the preferred third embodiment of the invention is deposited by the sputtering method. The sputtering method as referred to herein is a method in which an inert gas such as Ar is introduced in vacuo; plasma discharge is formed between a substrate and a sputtering target (hereinafter sometimes referred to as "target"); Ar having been ionized by the plasma discharge is allowed to collide with the target; and atoms of the target are beaten out and deposited on the substrate to form a thin film. By adopting the sputtering method, a Cu alloy film having substantially the same composition as the sputtering target can be deposited. That is, a thin film having excellent film in-plane uniformity of the components or film thickness can be easily formed as compared with thin films formed by an ion plating method, an electron beam vapor deposition method, or a vacuum vapor deposition method. Also, a thin film in which the alloying elements are uniformly dissolved in solid in an as-deposited state can be formed. Therefore, high-temperature oxidation resistance can be effectively revealed. As the sputtering method, any sputtering method such as a DC sputtering method, an RF sputtering method, a magnetron sputtering method and a reactive sputtering method may be adopted, and its forming condition may be properly set.

For example, in order to form the foregoing Cu—X1 alloy film by the sputtering method, so far as a sputtering target composed of a Cu alloy containing a prescribed amount of the foregoing adhesion enhancing element X1 and having the same composition as the desired Cu—X1 alloy film is used as the target, a Cu—X1 alloy film having desired components/composition can be formed without causing a composition divergence, and hence, such is suitable. The composition of the sputtering target may be adjusted by using a Cu alloy target having a different composition, or it may be adjusted by chipping a metal of the alloying element on a pure Cu target.

According to the sputtering method, a slight divergence is possibly generated between a composition of the deposited Cu alloy film and a composition of the sputtering target. But, such a divergence is in general within several atomic %. Then, by controlling the composition of the sputtering target within the range of ±10 atomic % at maximum, a Cu alloy film having a desired composition can be deposited.

The shape of the target includes those processed into an arbitrary shape (e.g., a square-shaped plate form, a circular plate form, a donut plate form, etc.) depending upon the shape or structure of a sputtering apparatus.

Examples of a manufacturing method of the foregoing target include a method of obtaining a target by manufacturing an ingot composed of a Cu-based alloy by a melt-forging method, a powder sintering method, or a spray foaming method; and a method of obtaining a target by manufacturing a preform composed of a Cu-based alloy (intermediate before obtaining a final dense body) and then densifying the preform by means of densification.

The Cu alloy film which is used in the preferred third embodiment of the invention is excellent in adhesion to the substrate and/or the insulating film, and therefore, it is suitably used as the interconnection film and the film for electrode which come into direct contact therewith. In the preferred third embodiment of the invention, the source electrode and/or the drain electrode is preferably composed of the Cu alloy film, and the component composition of the other interconnection part (for example, the gate electrode) is not particularly limited. For example, in FIG. 1, the gate electrode, a scanning line (not shown), and a drain interconnection part (not shown) in a signal line may also be composed of the foregoing Cu alloy film. In that case, all of the Cu alloy interconnections in the TFT substrate can be formed of the same component composition.

In the light of the above, the Cu alloy film most characterizing the preferred third embodiment of the invention has been described in detail.

In the preferred third embodiment of the invention, a characteristic feature resides in the foregoing Cu alloy film, and the other constituent features are not particularly limited.

As a preferred fourth embodiment of the invention, examples thereof include an interconnection structure in which an insulating film is included between the interconnection film and the substrate; and the interconnection film is a Cu film.

The interconnection structure of the preferred fourth embodiment of the invention includes an insulating film composed mainly of silicon oxide, silicon oxynitride or the like, a Cu film, and an oxide semiconductor layer of a thin film transistor in this order from the side of the substrate. In the preferred fourth embodiment of the invention, different from the case of the above-described Non-Patent Document 1 (using an Al material for the source-drain electrode), Cu having a low electrical resistivity is used as the source-drain electrode material, and therefore, the electrical resistance of the film itself is low, and the contact resistance to the oxide semiconductor layer or the transparent conductive film constituting the pixel electrode is suppressed in a low level. In particular, in the preferred fourth embodiment of the invention, the heating temperature after the deposition of a Cu film is controlled within a prescribed range, and therefore, it has become possible to surely ensure low contact resistance to the oxide semiconductor layer with good reproducibility.

The "Cu film" as referred to in this description means a film composed of pure Cu, and the pure Cu as referred to herein means one having a Cu content of generally 99 or more. So far as the foregoing requirements are satisfied, the pure Cu may contain Fe and/or Co in an amount of from 0.02 to 1.0 atomic % in total (when Fe or Co is contained alone, the content is an alone content).

The foregoing Cu film is preferably connected directly to the oxide semiconductor layer.

Figure 2:
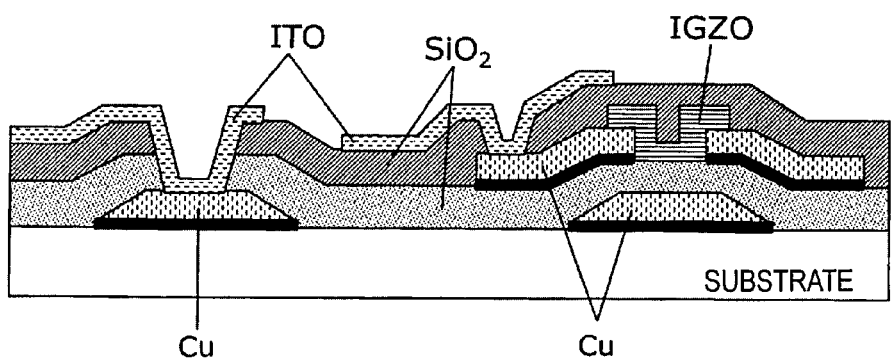
FIG. 2 is a schematic cross sectional explanatory view showing a representative interconnection structure of the invention.

The Cu film is preferably connected directly to a transparent conductive film (representatively ITO, IZO, etc.) constituting a pixel electrode (see FIG. 2).

The interconnection structure of the preferred fourth embodiment of the invention and a preferred embodiment of a manufacturing method thereof are hereunder described by reference to the above-described FIG. 2, but it should not be construed that the invention is limited thereto. While FIG. 2 illustrates an example of the bottom gate type, the invention is not limited thereto, but the top gate type is also encompassed. Also, in FIG. 2, while IGZO is used as a representative example of the oxide semiconductor layer, the invention is not limited thereto, but all of oxide semiconductors used for a display device such as a liquid crystal display device can be used.

The TFT substrate shown in FIG. 2 has an interconnection structure (bottom gate type) in which a gate electrode (Cu in the drawing), a gate insulating film ($SiO_2$ in the drawing), a source electrode/drain electrode (Cu in the drawing), a channel layer (an oxide semiconductor layer; IGZO in the drawing), and a protective layer ($SiO_2$ in the drawing) are laminated in this order from the side of the substrate. The interconnection film constituting the gate electrode or the source electrode/drain electrode is composed of Cu. Here, the protective layer in FIG. 2 may also be silicon oxynitride, and similarly, the gate insulating film may also be silicon oxynitride. As described above, this is because in the oxide semiconductor, its excellent properties are lost under a reducing atmosphere, and therefore, the use of silicon oxide (silicon oxynitride) capable of undergoing deposition under an oxidizing atmosphere is recommended. Alternatively, either the protective layer or the gate insulating film may be silicon nitride.

In FIG. 2, the Cu film constituting the source electrode/drain electrode comes into contact with the substrate and/or the insulating film via a high melting point metal such as Mo and Cr, and therefore, its adhesion thereto is enhanced. On the other hand, the foregoing Cu film is connected directly to the oxide semiconductor layer. According to the preferred fourth embodiment of the invention, original properties of Cu that the electrical resistivity is low as compared with Al; and that the contact resistance with the oxide semiconductor layer and/or the transparent conductive film constituting a pixel electrode is suppressed in a low level are effectively exhibited. Furthermore, according to the preferred fourth embodiment of the invention, in general, the heat treatment after the deposition of Cu is performed while controlling the temperature within the range of higher than 300° C. and 450° C. or lower, and therefore, the low contact resistance between the Cu film and the oxide semiconductor layer can be surely ensured with good reproducibility. As demonstrated in the Examples as described later, it has become clear that when the heat treatment is performed at a temperature of 300° C. or lower, scattering in the contact resistance with the oxide semiconductor layer is caused.

Inclusive of the foregoing preferred first to fourth embodiments, the foregoing oxide semiconductor layer in the interconnection structure of the invention is not particularly limited so far as it is an oxide semiconductor used for liquid crystal display devices and the like. For example, those composed of an oxide containing at least one element selected from the group consisting of In, Ga, Zn, Ti, and Sn are used. Specific examples of the foregoing oxide include transparent oxides such as In oxide, In—Sn oxide, In—Zn oxide, In—Sn—Zn oxide, In—Ga oxide, Zn—Sn oxide, Zn—Ga oxide, In—Ga—Zn oxide, Zn oxide and Ti oxide; and AZTO and GZTO obtained by doping Zn—Sn oxide with Al and Ga, respectively.

Also, as the transparent conductive film constituting a pixel electrode, examples thereof include an oxide conductive film which is usually used for a liquid crystal display device or the like. Examples thereof include a conductive film composed of an oxide containing at least one element selected from the group consisting of In, Ga, Zn, and Sn. Typical examples thereof include amorphous ITO, poly-ITO, IZO and ZnO.

Also, the insulating film such as a gate insulating film and the protective film formed on the oxide semiconductor (hereinafter sometimes represented by "insulating film") are not particularly limited, and examples thereof include those which are usually used, such as silicon nitride, silicon oxide and silicon oxynitride. However, from the viewpoint of effectively exhibiting the properties of the oxide semiconductor, the use of silicon oxide or silicon oxynitride capable of undergoing deposition under an acidic atmosphere is preferable. In detail, the foregoing insulating film is not necessarily composed of only silicon oxide, and an insulating film containing at least oxygen to such an extent that the properties of the oxide semiconductor are effectively exhibited can be used in the invention. For example, silicon oxide in which only the surface thereof is nitrided, Si in which only the surface thereof is oxidized or the like may be used. In the case where the insulating film contains oxygen, in general, a thickness of the insulating film is preferably 0.17 nm or more and 3 nm or less. Also, in general, a maximum value of a ratio ([O]/[Si]) of the oxygen atomic number ([O]) to the Si atomic number ([Si]) is preferably within the range of 0.3 or more and 2.0 or less.

The substrate is not particularly limited so far as it is used for a liquid crystal display device or the like. Representative examples thereof include a transparent substrate represented by a glass substrate or the like. A material of the glass substrate is not particularly limited so far as it is used for a display device, and examples thereof include alkali-free glass, glass having a high strain point, soda lime glass, and so on. Alternatively, examples thereof also include substrates such as flexible resin films and metal foils.

In manufacturing a display device including the foregoing interconnection structure, there are no particular limitations, except that not only the requirements of the invention are satisfied, but the conditions of the heat treatment/heat history the Cu alloy film or the Al alloy film is the above-recommended condition, and general steps for a display device may be adopted.

EXAMPLES

The invention is more specifically described below with reference to Examples, but it should not be construed that the invention is limited to the following Examples. The invention can also be practiced by applying modifications within a range adaptable to the purports described above and described below, and all of them are encompassed in the technical scope of the invention.

Example 1-1

An alkali-free glass plate (plate thickness: 0.7 mm) was used as a substrate, and an Al alloy film having each of various alloy compositions shown in Table 1 (with the remainder being Al and inevitable impurities) was deposited on the surface thereof by the DC magnetron sputtering method. The deposition condition is as follows. Al alloy targets having various compositions, which were formed by the vacuum melting method, were used as a sputtering target.
(Deposition Condition of Al Alloy Film)
  Atmosphere gas: Argon
  Pressure: 2 mTorr
  Substrate temperature: 25° C. (room temperature), or heating at 200° C. for 30 minutes
  Film thickness: 300 nm A content of each of the alloying elements in the foregoing Al alloy films was determined by the ICP emission spectrometry (inductively coupled plasma emission spectrometry) method.

Each of the above-deposited Al alloy films was used, and an electrical resistivity of the Al alloy film itself after a heat treatment and direct contact resistance of the Al alloy film when connected directly to a transparent pixel electrode (ITO) or an oxide semiconductor (IGZO or IZO) (contact resistance with ITO, contact resistance with IGZO, or contact resistance with IZO) were measured in the following methods.

(1) Electrical Resistivity of Al Alloy Film Itself after Heat Treatment

The Al alloy film was subjected to a heat treatment at 250° C. for 15 minutes in an inert gas atmosphere, followed by measuring for an electrical resistivity by the four probe method. Then, whether the electrical resistivity of the Al alloy film itself after the heat treatment was good or bad was decided according to the following criteria.
(Criteria of Judgment)
  ○: Less than 5.0 μΩ·cm
  x: 5.0 μΩ·cm or more (2) Contact Resistance with Transparent Pixel Electrode (ITO)

Figure 9:
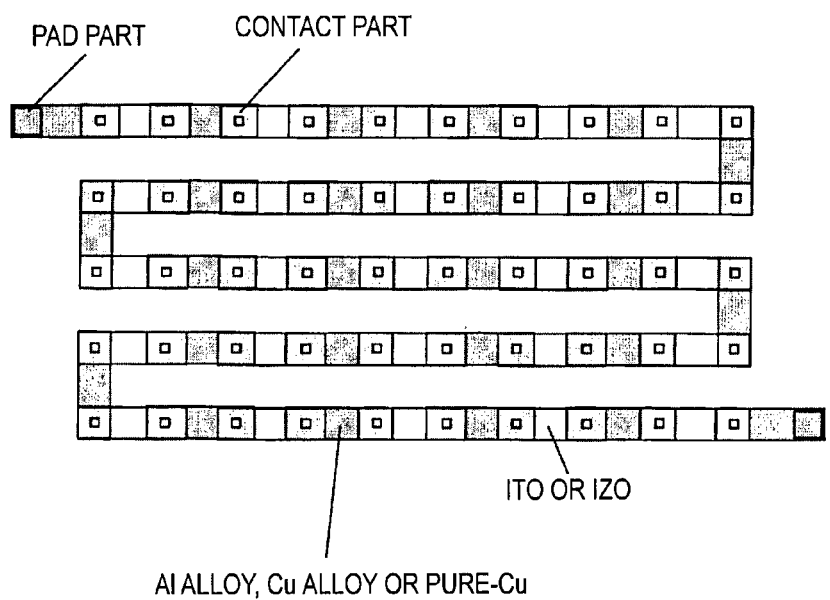
FIG. 9 is a view showing an electrode pattern used for the measurement of a contact resistivity with ITO or IZO in the Examples.

Each of the above-deposited Al alloy films was successively subjected to photolithography and etching, thereby forming an electrode pattern shown in FIG. 9. Subsequently, a silicon nitride ($SiN_x$) film having a film thickness of 300 nm was formed by a CVD apparatus. At that time, the deposition was performed at a temperature of 250° C. or 320° C. as shown in Table 1. Also, the deposition time is 15 minutes in all of the cases. The alloying element was deposited as a deposit by a heat history at this time. Subsequently, photolithography and etching by an RIE (Reactive Ion Etching) apparatus were performed, thereby forming contact hole on the SiN film. After forming the contact hole, the resist was removed, and the surface of the Al alloy thin film was etched at room temperature by means of a wet treatment with an alkaline solution (aqueous solution obtained by diluting AZ 300MIF Developer (2.38 wt %) (manufactured by AZ Electronic Materials) to an extent of 0.4%). Subsequently, a roughness Rz of a convex part of the Al alloy thin film [a maximum height roughness Rz in conformity with JIS B0601 (2001)] was measured. The maximum height roughness Rz was measured by using a surface roughness meter, SJ-301, manufactured by Mitsutoyo Corporation. An evaluation length was set to 4 mm, and whether the maximum height roughness Rz was good or bad was decided according to the following criteria.
(Criteria of Judgment)
○: 5 nm or more
x: Less than 5 nm Thereafter, an ITO film (transparent conductive film) was deposited under the following condition by the sputtering method, followed by subjecting to photolithography and patterning, thereby forming a contact chain pattern in which 50 contact parts of 10 μm square were connected in series (see FIG. 9). In FIG. 9, a line width of each of the Al alloy and ITO is 80 μm.
(Deposition Condition of ITO Film)
Atmosphere gas: Argon
Pressure: 0.8 mTorr
Substrate temperature: 25° C. (room temperature)
Film thickness: 200 nm Total resistance (contact resistance and connection resistance) of the foregoing contact chain was determined by bringing a probe into contact with each of pad parts of the both ends of the contact chain pattern by using HEWLETT PACKARD 4156A and Precision Semiconductor Parameter Analyzer of Agilent Technologies 4156C and measuring I-V properties by means of two-probe measurement. Then, a contact resistance value as converted into single contact was determined, and whether the direct contact resistance with ITO (contact resistance with ITO) was good or bad was decided according to the following criteria. In this Example, ○ or Δ was accepted.
(Criteria of Judgment)
○: Less than 1,000Ω
Δ: 1,000Ω or more and less than 3,000Ω
x: 3,000Ω or more (3) Contact Resistance with Transparent Pixel Electrode (IZO):

An Al alloy film was subjected to each of various heat treatments, followed by etching by means of a wet treatment, and then measuring for a maximum height roughness Rz of a convex part of an Al alloy thin film in the same manners as those described above in the case of (2) contact resistance with ITO, except that IZO was used in place of ITO.

Thereafter, an IZO film (transparent conductive film) was deposited under the following condition by the sputtering method, followed by subjecting to photolithography and patterning, thereby forming a contact chain pattern in which 50 contact parts of 10 μm square were connected in series (see FIG. 9). In FIG. 9, a line width of each of the Al alloy and IZO is 80 μm.
(Deposition Condition of IZO Film)
Atmosphere gas: Argon
Pressure: 0.8 mTorr
Substrate temperature: 25° C. (room temperature)
Film thickness: 200 nm Total resistance (contact resistance and connection resistance) of the foregoing contact chain was measured in the same manner as that described above in (2), a contact resistance value as converted into single contact was determined, and whether the direct contact resistance with IZO (contact resistance with IZO) was good or bad was decided according to the following criteria. In this Example, ○ or Δ was accepted.

(Criteria of Judgment)
○: Less than 1,000Ω
Δ: 1,000Ω or more and less than 3,000Ω
x: 3,000Ω or more (4) Contact Resistance with Oxide Semiconductor (IGZO)

Figure 10:
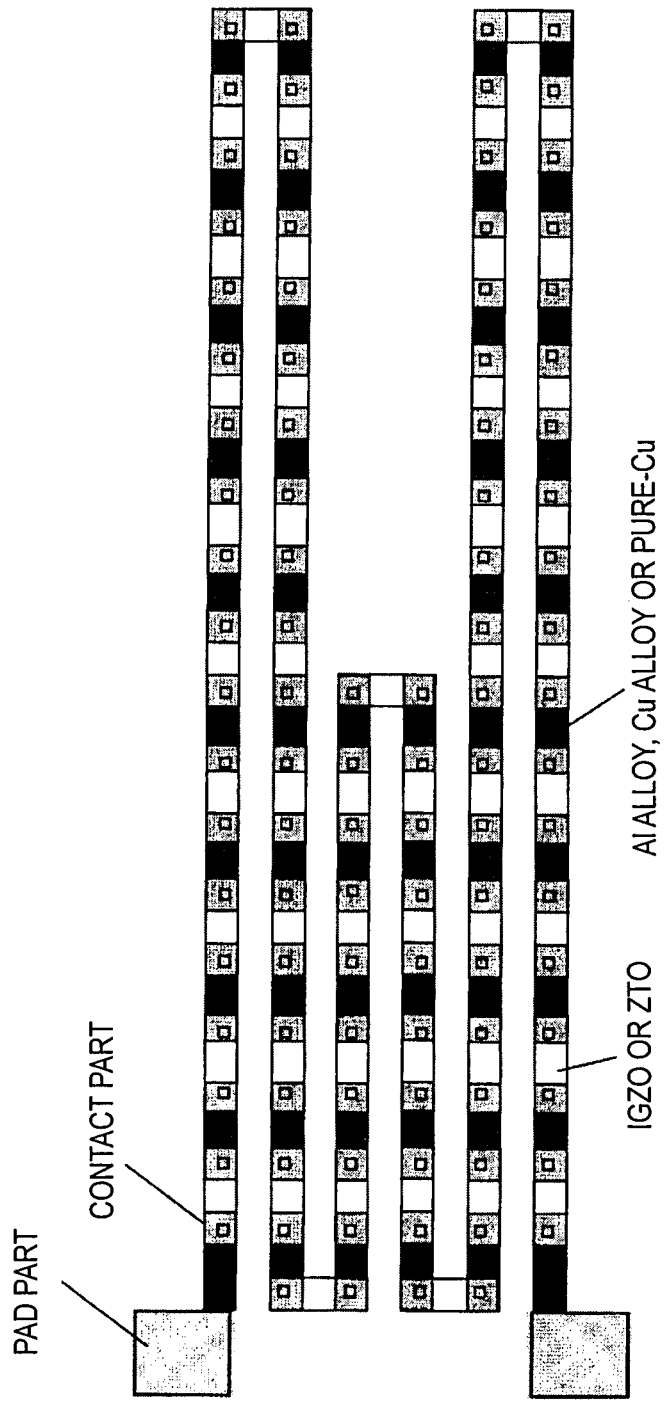
FIG. 10 is a view showing an electrode pattern used for the measurement of a contact resistivity with IGZO or ZTO in the Examples.

An Al alloy film was subjected to each of various heat treatments, followed by etching by means of a wet treatment, and then measuring for a maximum height roughness Rz of a convex part of an Al alloy thin film in the same manners as those described above in the case of (2) contact resistance with ITO, except that an electrode pattern shown in FIG. 10 was used.

Thereafter, an IGZO film was deposited under the following condition by means of sputtering, followed by subjecting to photolithography and patterning, thereby forming a contact chain pattern in which 100 contacts of 80 μm square were connected in series. In FIG. 10, a line width of each of the Al alloy and IGZO is 80 μm. Sputtering targets of IGZO having a composition of In/Ga/Zn of 1/1/1 and 2/2/1, respectively were used.
(Deposition Condition of Oxide Semiconductor)
Atmosphere gas: Argon
Pressure: 5 mTorr
Substrate temperature: 25° C. (room temperature)
Film thickness: 100 nm Total resistance (contact resistance and connection resistance) of the foregoing contact chain was measured in the same manner as that described above in (2), a contact resistance value as converted into single contact was determined, and whether the direct contact resistance with IGZO (contact resistance with IGZO) was good or bad was decided according to the following criteria. In this Example, ○ or Δ was accepted.
(Criteria of Judgment)
○: Less than 1,000Ω
Δ: 1,000Ω or more and less than 3,000Ω
x: 3,000Ω or more (5) Contact Resistance with Oxide Semiconductor (ZTO)

An Al alloy film was subjected to each of various heat treatments, followed by etching by means of a wet treatment, and then measuring for a maximum height roughness Rz of a convex part of an Al alloy thin film in the same manners as those described above in the case of (2) contact resistance with ITO, except that an electrode pattern shown in FIG. 10 was used.

Thereafter, a ZTO film was deposited under the following condition by means of sputtering, followed by subjecting to photolithography and patterning, thereby forming a contact chain pattern in which 100 contacts of 80 μm square were connected in series. In FIG. 10, a line width of each of the Al alloy and ZTO is 80 μm. A sputtering target of ZTO having a composition of Zn/Sn of 2/1 was used.
(Deposition Condition of Oxide Semiconductor)
Atmosphere gas: Argon
Pressure: 5 mTorr
Substrate temperature: 25° C. (room temperature)
Film thickness: 100 nm Total resistance (contact resistance and connection resistance) of the foregoing contact chain was measured in the same manner as that described above in (2), a contact resistance value as converted into single contact was determined, and whether the direct contact resistance with ZTO (contact resistance with ZTO) was good or bad was decided according to the following criteria. In this Example, ○ or Δ was accepted.

(Criteria of Judgment)
○: Less than 1,000Ω
Δ: 1,000Ω or more and less than 3,000Ω
x: 3,000Ω or more (6) Deposit Density A density of the deposit was determined by using a reflection electron image of a scanning electron microscope. Specifically, the number of deposits in one visual field (100 μm²) was measured, an average value of those in three visual fields was determined, and whether the deposit density was good or bad was decided according to the following criteria. In this Example, ○ or Δ was accepted.

(Criteria of Judgment)
○: 40 ore more
Δ: 30 or more and less than 40
x: Less than 30

These results are summarized and shown in Tables 1 and 2.

In Table 1, the column of "Heat deposition (at 200° C.)" means a substrate temperature during the deposition of the Al alloy, wherein "○" is concerned with an example in which the substrate temperature is 200° C., and "–" is concerned with an example in which the substrate temperature is room temperature.

Also, in Table 1, in the column of "Surface roughness Rz of Al alloy film", the results of Rz of the Al alloy film connected directly to ITO, IZO, and IGZO are summarized and shown, wherein "○" means that the evaluation results of the both are ○ (Rz is 5 nm or more), and "x" means that the evaluation results of the both are x (Rz is less than 5 nm).

TABLE 1

| No. | Alloy Composition | Heat Deposition (200° C.) | Wet Treatment | Heat Treatment Temperature or CVD Deposition Temperature [° C.] | Surface Roughness Rz of Al Alloy Film (nm) |
|---|---|---|---|---|---|
| 1 | P—Al | — | — | — | — |
| 2 | Al—0.05Ni | — | ○ | 250 | ○ |
| 3 | Al—0.1Ni | — | ○ | 250 | ○ |
| 4 | Al—1Ni | — | ○ | 250 | ○ |
| 5 | Al—2Ni | — | ○ | 250 | ○ |
| 6 | Al—4Ni | — | ○ | 250 | ○ |
| 7 | Al—0.05Co | — | ○ | 250 | ○ |
| 8 | Al—0.1Co | — | ○ | 250 | ○ |
| 9 | Al—1Co | — | ○ | 250 | ○ |
| 10 | Al—2Co | — | ○ | 250 | ○ |
| 11 | Al—4Co | — | ○ | 250 | ○ |
| 12 | Al—0.1Ni—0.5Ge—0.2Nd | — | ○ | — | X |
| 13 | Al—0.1Ni—0.5Ge—0.2Nd | ○ | ○ | — | ○ |
| 14 | Al—0.1Ni—0.5Ge—0.2Nd | — | ○ | 250 | ○ |
| 15 | Al—0.1Ni—0.5Ge—0.2Nd | ○ | ○ | 250 | ○ |
| 16 | Al—0.1Ni—0.5Ge—0.2Nd | — | ○ | 320 | ○ |
| 17 | Al—0.1Ni—0.5Ge—0.2Nd | ○ | ○ | 320 | ○ |
| 18 | Al—0.2Ni—0.5Ge—0.2Nd | — | ○ | 250 | ○ |
| 19 | Al—1Ni—0.5Ge—0.2Nd | — | ○ | 250 | ○ |
| 20 | Al—4Ni—0.5Ge—0.2Nd | — | ○ | 250 | ○ |
| 21 | Al—0.05Ni—0.5Ge—0.5Nd | — | ○ | 250 | ○ |
| 22 | Al—0.1Ni—0.5Ge—0.5Nd | — | ○ | 250 | ○ |
| 23 | Al—1.0Ni—0.5Ge—0.5Nd | — | ○ | 250 | ○ |
| 24 | Al—0.1Ni—0.5Ge—0.2Gd | — | ○ | 250 | ○ |
| 25 | Al—1Ni—0.5Ge—0.2Gd | — | ○ | 250 | ○ |
| 26 | Al—4Ni—0.5Ge—0.2Gd | — | ○ | 250 | ○ |
| 27 | Al—0.1Ni—0.5Ge—0.5Gd | — | ○ | 250 | ○ |
| 28 | Al—1Ni—0.5Ge—0.5Gd | — | ○ | 250 | ○ |
| 29 | Al—4Ni—0.5Ge—0.5Gd | — | ○ | 250 | ○ |
| 30 | Al—0.05Co—0.5Ge—0.2La | — | ○ | 250 | ○ |
| 31 | Al—0.1Co—0.5Ge—0.2La | — | ○ | 250 | ○ |
| 32 | Al—0.2Co—0.5Ge—0.1La | — | ○ | 250 | ○ |
| 33 | Al—0.2Co—0.5Ge—0.2La | — | ○ | 250 | ○ |
| 34 | Al—1.0Co—0.5Ge—0.2La | — | ○ | 250 | ○ |
| 35 | Al—4.0Co—0.5Ge—0.2La | — | ○ | 250 | ○ |
| 36 | Al—0.05Ni—0.5Cu—0.3La | — | ○ | 250 | ○ |
| 37 | Al—0.1Ni—0.5Cu—0.3La | — | ○ | 250 | ○ |
| 38 | Al—1Ni—0.5Cu—0.3La | — | ○ | 250 | ○ |
| 39 | Al—1Ni—0.5Cu—0.3La | — | ○ | 320 | ○ |
| 40 | Al—2Ni—0.5Cu—0.3La | — | ○ | 250 | ○ |
| 41 | Al—4Ni—0.5Cu—0.3La | — | ○ | 250 | ○ |
| 42 | Al—1Ni—0.1Cu—0.3La | — | ○ | 250 | ○ |
| 43 | Al—1Ni—1Cu—0.3La | — | ○ | 250 | ○ |
| 44 | Al—0.2Ni—0.35La | — | ○ | 250 | ○ |
| 45 | Al—0.2Ni—0.35La | — | X | 250 | X |
| 46 | Al—2Ni—0.35La | — | ○ | 250 | ○ |
| 47 | Al—0.05Co—0.5Cu—0.3La | — | ○ | 250 | ○ |
| 48 | Al—0.1Co—0.5Cu—0.3La | — | ○ | 250 | ○ |
| 49 | Al—1Co—0.5Cu—0.3La | — | ○ | 250 | ○ |
| 50 | Al—2Co—0.5Cu—0.3La | — | ○ | 250 | ○ |
| 51 | Al—4Co—0.5Cu—0.3La | — | ○ | 250 | ○ |

*1): The reminder: Al and inevitable impurities
*2): The numerical value is a proportion (atomic %) occupying in the Al alloy film.

TABLE 2

| No. | Contact Resistivity with IGZO (1/1/1) [Ω] | Contact Resistivity with IGZO (2/2/1) [Ω] | Contact Resistivity with ZTO (2/1) [Ω] | Contact Resistivity with ITO [Ω] | Contact Resistivity with ZITO [Ω] | Electric Resistivity (μΩ·cm) (250° C.) | Deposit Density (count/100 μm$^2$) | Total Judgment |
|---|---|---|---|---|---|---|---|---|
| 1 | X | X | X | X | X | ○ | X | X |
| 2 | X | X | X | X | X | ○ | X | X |
| 3 | Δ | Δ | Δ | Δ | Δ | ○ | Δ | Δ |
| 4 | ○ | ○ | ○ | ○ | ○ | ○ | ○ | ○ |
| 5 | ○ | ○ | ○ | ○ | ○ | ○ | ○ | ○ |
| 6 | ○ | ○ | ○ | ○ | ○ | X | ○ | X |
| 7 | X | X | X | X | X | ○ | X | X |
| 8 | Δ | Δ | Δ | Δ | Δ | ○ | Δ | Δ |
| 9 | ○ | ○ | ○ | ○ | ○ | ○ | ○ | ○ |
| 10 | ○ | ○ | ○ | ○ | ○ | ○ | ○ | ○ |
| 11 | ○ | ○ | ○ | ○ | ○ | X | ○ | X |
| 12 | X | X | X | X | X | ○ | X | X |
| 13 | Δ | Δ | Δ | Δ | Δ | ○ | Δ | Δ |
| 14 | ○ | ○ | ○ | ○ | ○ | ○ | ○ | ○ |
| 15 | ○ | ○ | ○ | ○ | ○ | ○ | ○ | ○ |
| 16 | ○ | ○ | ○ | ○ | ○ | ○ | ○ | ○ |
| 17 | ○ | ○ | ○ | ○ | ○ | ○ | ○ | ○ |
| 18 | ○ | ○ | ○ | ○ | ○ | ○ | ○ | ○ |
| 19 | ○ | ○ | ○ | ○ | ○ | ○ | ○ | ○ |
| 20 | ○ | ○ | ○ | ○ | ○ | X | ○ | X |
| 21 | X | X | X | X | X | ○ | X | X |
| 22 | ○ | ○ | ○ | ○ | ○ | ○ | ○ | ○ |
| 23 | ○ | ○ | ○ | ○ | ○ | ○ | ○ | ○ |
| 24 | ○ | ○ | ○ | ○ | ○ | ○ | ○ | ○ |
| 25 | ○ | ○ | ○ | ○ | ○ | ○ | ○ | ○ |
| 26 | ○ | ○ | ○ | ○ | ○ | X | ○ | X |
| 27 | ○ | ○ | ○ | ○ | ○ | ○ | ○ | ○ |
| 28 | ○ | ○ | ○ | ○ | ○ | ○ | ○ | ○ |
| 29 | ○ | ○ | ○ | ○ | ○ | X | ○ | X |
| 30 | X | X | X | X | X | ○ | X | X |
| 31 | ○ | ○ | ○ | ○ | ○ | ○ | ○ | ○ |
| 32 | ○ | ○ | ○ | ○ | ○ | ○ | ○ | ○ |
| 33 | ○ | ○ | ○ | ○ | ○ | ○ | ○ | ○ |
| 34 | ○ | ○ | ○ | ○ | ○ | ○ | ○ | ○ |
| 35 | ○ | ○ | ○ | ○ | ○ | X | ○ | X |
| 36 | X | X | X | X | X | ○ | X | X |
| 37 | ○ | ○ | ○ | ○ | ○ | ○ | ○ | ○ |
| 38 | ○ | ○ | ○ | ○ | ○ | ○ | ○ | ○ |
| 39 | ○ | ○ | ○ | ○ | ○ | ○ | ○ | ○ |
| 40 | ○ | ○ | ○ | ○ | ○ | ○ | ○ | ○ |
| 41 | ○ | ○ | ○ | ○ | ○ | X | ○ | X |
| 42 | ○ | ○ | ○ | ○ | ○ | ○ | ○ | ○ |
| 43 | ○ | ○ | ○ | ○ | ○ | ○ | ○ | ○ |
| 44 | ○ | ○ | ○ | ○ | ○ | ○ | ○ | ○ |
| 45 | X | X | X | X | X | ○ | X | X |
| 46 | ○ | ○ | ○ | ○ | ○ | ○ | ○ | ○ |
| 47 | X | X | X | X | X | ○ | X | X |
| 48 | ○ | ○ | ○ | ○ | ○ | ○ | ○ | ○ |
| 49 | ○ | ○ | ○ | ○ | ○ | ○ | ○ | ○ |
| 50 | ○ | ○ | ○ | ○ | ○ | ○ | ○ | ○ |
| 51 | ○ | ○ | ○ | ○ | ○ | X | ○ | X |

From the results shown in Tables 1 and 2, the following consideration can be made.

First of all, when the Al alloy specified in the invention (containing Ni and/or Co, further containing Cu and/or Ge, and further containing a rare earth element) was used, as compared with the case of using pure Al (No. 1), the contact resistance with each of IGZO (oxide semiconductor), ZTO (oxide semiconductor), ITO (transparent conductive film), and IZO (transparent conductive film) could be reduced while keeping a low electrical resistivity (see Nos. 3 to 5, 8 to 10, 13 to 19, 22 to 25, 27, 28, 31 to 34, 37 to 40, 42 to 44, 46, and 48 to 50).

In detail, a deposit/enriched layer of Ni and/or Co was formed at an interface between such an Al alloy film and IGZO, ITO or IZO, and the surface roughness Rz of the Al alloy film was 5 nm or more in all of the cases. So far as the heat treatment condition is concerned, in all of the case where the substrate temperature during the deposition of the Al alloy is heated at 200° C. (heat deposition), and a subsequent heat treatment is not performed as in No. 13; the case where the substrate is not heated (room temperature is kept), and the heating temperature after the deposition of the Al alloy is increased to 250° C. or 320° C. as in Nos. 3 to 5, 8 to 10, 14, 16, 24, 25, 27, and 28; and the case where the substrate temperature is heated at 200° C. (heat deposition), and the heating temperature after the deposition of the Al alloy is increased to 250° C. or 320° C. as in Nos. 15 and 17, the surface roughness Rz of the Al alloy film was 5 nm or more, and the contact resistance was suppressed in a low level. In the example in which the heat deposition was performed as in No. 13, as shown in Table 1, the contact resistance with each of IGZO, ZTO, ITO, and IZO slightly increases (Δ), a degree of which is, however, not a hindrance from the practical standpoint. Also, in Nos. 3 and 8, since the addition amount of Ni or Co is small, the deposit density is low (Δ), and the contact resistance slightly increases (Δ), a degree of which is, however, not a hindrance from the practical standpoint.

Figure 11:
FIG. 11 is a TEM image of No. 46 in Table 1.
Figure 12:
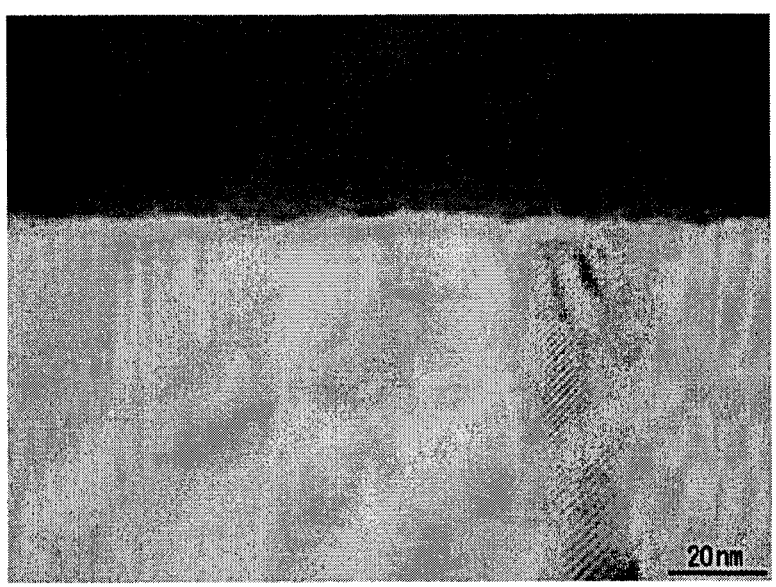
FIG. 12 is a TEM image of a sample formed for comparison.

FIG. 11 is a TEM image of No. 46 showing a state of an interface of an Al alloy (Al-2 at % Ni-0.35 at % La) and IGZO (In/Ga/Zn (atomic ratio) of 1/1/1) (an example in which the wet treatment and the heat treatment were performed). As shown in FIG. 11, it could be confirmed that a deposit containing Ni was formed at the interface between the Al alloy and IGZO and that the Al alloy came into direct contact with IGZO. FIG. 12 is a TEM image for comparison showing a state of the interface of the Al alloy having the same alloy composition as that in No. 46 and IGZO. In this comparative example, neither wet treatment nor heat treatment was performed, and as shown in FIG. 12, it could be confirmed that a deposit containing Ni and/or an enriched layer containing Ni was not formed at the interface of the Al alloy and IGZO.

On the other hand, No. 12 is concerned with an example in which all of the heat treatments of the heat deposition and the heat treatment after the deposition of the Al alloy were not performed. The surface roughness Rz of the Al alloy film was less than 5 nm, and the contact resistance with each of IGZO, ZTO, ITO, and IZO increased.

Also, Nos. 6, 20, 26, 29, and 41 are concerned with an example in which the Ni amount is large, and Nos. 11, 35, and 51 are concerned with an example in which the Co amount is large. In all of these examples, the electrical resistivity increased.

On the other hand, Nos. 2, 21, and 36 are concerned with an example in which the Ni amount is small, and Nos. 7, 30, and 47 are concerned with an example in which the Co amount is small. In all of these examples, the deposit density was not sufficient, and the contact resistance with each of IGZO, ZTO, ITO, and IZO increased.

Also, No. 45 is concerned with an example in which the wet treatment was not performed. The surface roughness Rz of the Al alloy film was less than 5 nm, the deposit density was not sufficient, and the contact resistance with each of IGZO, ZTO, ITO, and IZO increased.

In the respective alloy compositions of Table 1, it is confirmed from experiments that Nd and La do not adversely affect the reduction of the contact resistance with each of IGZO, ZTO, ITO, and IZO; and even when La is used in place of Nd, or Nd is used in place of La, the same effects are obtained. Similarly, it is confirmed from experiments that even when Gd is used in place of Nd or La, the same effects are obtained.

Example 2-1

In this Example, by using each of samples formed by the following method, adhesion to an insulating film on a substrate (in this Example, a silicon oxide film or a silicon oxynitride was formed while imitating a gate insulating film), contact resistance with an oxide semiconductor (IGZO or ZTO), and contact resistance with a transparent conductive film (ITO or IZO) were measured.

(Preparation of Sample)

First of all, a glass substrate (Eagle 2000, manufactured by Corning Incorporated, size: 50.8 mm in diameter×0.7 mm in thickness) was prepared, followed by subjecting to plasma CVD, thereby depositing a silicon oxide film or a silicon oxynitride film (all of these films had a film thickness of 300 nm). For the deposition of the silicon oxide film, a silane gas and $N_2O$ were used, whereas for the deposition of the silicon oxynitride film, a silane gas and an ammonia gas were used.

Subsequently, each of various Cu alloy films shown in Table 3 (the total film thickness was 300 nm and constant) was deposited on the foregoing insulating film by the DC magnetron sputtering method. In detail, a trade name of "HSM-552", manufactured by Shimadzu Corporation was used as a sputtering apparatus, and a Cu alloy film as the first layer (Y) and a pure Cu metal film as the second layer (X) were successively deposited on the silicon oxide film by the DC magnetron sputtering method [back pressure: $0.27 \times 10^{-3}$ Pa or less, atmosphere gas: Ar, Ar gas pressure: 2 mTorr, Ar gas flow rate: 30 sccm, sputter power: DC260W, distance between electrodes: 50.4 mm, substrate temperature: 25° C. (room temperature)], thereby obtaining a sample of a laminated interconnection film.

For the formation of the pure Cu film, pure Cu was used as a sputtering target. Also, for the formation of the Cu alloy film of various alloy components, a sputtering target formed by the vacuum melting method was used.

A composition of the above-deposited Cu alloy film was confirmed through quantitative analysis using an ICP emission spectrometer (ICP emission spectrometer "ICP-8000 Model", manufactured by Shimadzu Corporation).

For comparison, a sample composed of only pure Cu (No. 1 in Table 3) was prepared. A sample in which an amount of addition element such as Mn exceeded 20% was prepared; however, when the amount of addition element exceeded 20%, there was a caused problem that an undercut became large during the following etching, so that the following tests were not performed.

(Test of Adhesion to Insulating Film)

Each of the above-obtained samples was subjected to various heat treatments described in Table 3. In detail, the heat treatment was performed within a CVD apparatus in vacuo at 350° C. or 250° C. for 30 minutes.

The adhesion of each sample after the heat treatment was evaluated by a peeling test with a tape on the basis of the tape peeling test according to the JIS standards. In detail, cross-cuts (cross-cuts of 5×5) were provided at intervals of 1 mm on the surface of each sample by using a cutter knife. Subsequently, a black polyester tape, manufactured by Sumitomo 3M Limited (product No.: 8422B) was firmly stuck onto the foregoing surface; the tape was peeled off at once while keeping a peeling angle of the tape at 60°; the number of divisions of cross-cuts which had not been peeled off by the tape was counted; and a ratio to all of the divisions (film retention ratio) was determined. The measurement was performed three times, and an average value of those in the measurement of three times was defined as a film retention ratio of each sample.

In this Example, the case where the peeling ratio by tape is 0% or more and less than 10% was decided as "○", and the case where the peeling ratio by tape is 10% or more was decided as "x"; and ○ (the adhesion to the silicon oxide film was good) was accepted.

(Presence or Absence of Enriched Layer at an Interface Between Insulating Film and Cu Alloy Film)

Prior to performing the foregoing adhesion test, whether or not an enriched layer was formed in each sample was confirmed. In detail, in each sample, it was confirmed by a TEM image and an EDX line analysis of an interface that the enriched layer was formed at the interface with the substrate.

In this Example, the case where the enriched layer could be confirmed was decided as "○", and the case where the enriched layer could not be confirmed was decided as "x"; and ○ (the enriched layer was formed) was accepted.

(Measurement of Contact Resistance with IGZO)

Each of the above-obtained samples was successively subjected to photolithography and etching, thereby forming an electrode pattern shown in FIG. 10, followed by subjecting to various heat treatments described in Table 3. In detail, the heat treatment was performed within a CVD apparatus in vacuo at 350° C. or 250° C. for 30 minutes.

Subsequently, an IGZO film (oxide semiconductor) was deposited under the following condition by the sputtering method, followed by subjecting to photolithography and patterning, thereby forming a contact chain pattern in which 100 contact parts of 80 μm square were connected in series (see FIG. 10). In FIG. 10, a line width of each of the Cu alloy and IGZO is 80 μm. Sputtering targets of IGZO having a composition of In/Ga/Zn of 1/1/1 and 2/2/1, respectively were used.

(Deposition Condition of Oxide Semiconductor)
Atmosphere gas: Argon
Pressure: 5 mTorr
Substrate temperature: 25° C. (room temperature)
Film thickness: 100 nm A probe was brought into contact with a pad disposed in each of the both ends of the foregoing contact chain pattern, a voltage of from −0.1 V to +1.0 V was applied using an HP4156A semiconductor parameter analyzer, and I-V properties were measured by means of two-probe measurement, thereby determining contact chain resistance.

Then, a contact resistance value per contact was calculated and converted per unit area, thereby determining a contact resistivity with IGZO. The measurement was performed only one time. Whether the contact resistance with IGZO at once measurement was good or bad was decided according to the following criteria. In this Example, ○ or Δ was accepted.

○: The contact resistivity is less than $10^{-2} \Omega \cdot cm^2$.
Δ: The contact resistivity is $10^{-2} \Omega \cdot cm^2$ or more and $10^0 \Omega \cdot cm^2$ or less.
x: The contact resistivity exceeds $10^0 \Omega \cdot cm^2$.

(Measurement of Contact Resistance with ZTO)

Each of the above-obtained samples was successively subjected to photolithography and etching, thereby forming an electrode pattern shown in FIG. 10, followed by subjecting to various heat treatments described in Table 3. In detail, the heat treatment was performed within a CVD apparatus in vacuo at 350° C. or 250° C. for 5 minutes.

Subsequently, a ZTO film (oxide semiconductor) was deposited under the following condition by the sputtering method, followed by subjecting to photolithography and patterning, thereby forming a contact chain pattern in which 100 contact parts of 80 μm square were connected in series (see FIG. 10). In FIG. 10, a line width of each of the Cu alloy and ZTO is 80 μm. A sputtering target of ZTO having a composition of Zn/Sn of 2/1 was used.

(Deposition Condition of Oxide Semiconductor)
Atmosphere gas: Argon
Pressure: 5 mTorr
Substrate temperature: 25° C. (room temperature)
Film thickness: 100 nm A probe was brought into contact with a pad disposed in each of the both ends of the foregoing contact chain pattern, a voltage of from −0.1 V to +1.0 V was applied using an HP4156A semiconductor parameter analyzer, and I-V properties were measured by means of two-probe measurement, thereby determining contact chain resistance. Furthermore, by imitating the heat treatment during depositing a protective layer, a heat treatment was performed in a vacuum atmosphere at 250° C., 300° C., or 350° C. for 30 minutes by using a CVD apparatus (see Table 3), and contact chain resistance after the heat treatment was measured.

Then, a contact resistance value per contact was calculated and converted per unit area, thereby determining a contact resistivity with IGZO. Whether the contact resistance with IGZO was good or bad was decided according to the following criteria. In this Example, ○ or Δ was accepted.

○: The contact resistivity is less than $10^{-2} \Omega \cdot cm^2$.
Δ: The contact resistivity is $10^{-2} \Omega \cdot cm^2$ or more and $10^0 \Omega \cdot cm^2$ or less.
x: The contact resistivity exceeds $10^0 \Omega \cdot cm^2$.

(Contact Resistance with ITO)

Each of the above-deposited Cu alloy films was successively subjected to photolithography and etching, thereby forming an electrode pattern shown in FIG. 9. Subsequently, a silicon nitride ($SiN_x$) film having a film thickness of 300 nm was formed by a CVD apparatus. At that time, the deposition was performed at a temperature of 250° C. or 320° C. as shown in Table 3. Also, the deposition time is 30 minutes in all of the cases. The alloying element was deposited as a deposit by a heat history at this time. Subsequently, photolithography and etching by an RIE (Reactive Ion Etching) apparatus were performed, thereby forming a contact hole on the silicon nitride film.

Subsequently, an ITO film (transparent conductive film) was deposited under the following condition by the sputtering method, followed by subjecting to photolithography and patterning, thereby forming a contact chain pattern in which 50 contact parts of 10 μm square were connected in series (see FIG. 9). In FIG. 9, a line width of each of the Cu alloy and ITO is 80 μm.

(Deposition Condition of ITO Film)
Atmosphere gas: Argon
Pressure: 0.8 mTorr
Substrate temperature: 25° C. (room temperature)
Film thickness: 200 nm Total resistance (contact resistance and connection resistance) of the foregoing contact chain was determined by bringing a probe into contact with each of pad parts of the both ends of the contact chain pattern by using HEWLETT PACKARD 4156A and Precision Semiconductor Parameter Analyzer of Agilent Technologies 4156C and measuring I-V properties by means of two-probe measurement. Then, a contact resistance value as converted into single contact was determined, and whether the direct contact resistance with ITO (contact resistance with ITO) was good or bad was decided according to the following criteria. In this Example, ○ or Δ was accepted.

(Criteria of Judgment)
○: The contact resistivity is less than $10^{-2} \Omega \cdot cm^2$.
Δ: The contact resistivity is $10^{-2} \Omega \cdot cm^2$ or more and $10^0 \Omega \cdot cm^2$ or less.
x: The contact resistivity exceeds $10^0 \Omega \cdot cm^2$.

(Contact Resistance with IZO)

Similar to the foregoing ITO, each of the above-deposited Cu alloy films was successively subjected to photolithography and etching, thereby forming an electrode pattern shown in FIG. 9 and also forming a silicon nitride ($SiN_x$) film. At that time, the alloying element was deposited as a deposit by a heat history. Subsequently, a contact hole was formed on the silicon nitride film, and IZO (transparent conductive film) was deposited under the following condition by the sputtering method, followed by subjecting to photolithography and patterning, thereby forming a contact chain pattern in which 50 contact parts of 10 μm square were connected in series (see FIG. 9). In FIG. 9, a line width of each of the Cu alloy and IZO is 80 μm.

(Deposition Condition of IZO Film)
Atmosphere gas: Argon
Pressure: 0.8 mTorr
Substrate temperature: 25° C. (room temperature)
Film thickness: 200 nm Total resistance (contact resistance and connection resistance) of the foregoing contact chain was determined in the same manner as that in the foregoing ITO film. Then, a contact resistance value as converted into single contact was determined, and whether the direct contact resistance with IZO (contact resistance with IZO) was good or bad was decided according to the following criteria. In this Example, ○ or Δ was accepted.

(Criteria of Judgment)
○: The contact resistivity is less than $10^{-2}\,\Omega\cdot cm^2$.
Δ: The contact resistivity is $10^{-2}\,\Omega\cdot cm^2$ or more and $10^{0}\,\Omega\cdot cm^2$ or less.
x: The contact resistivity exceeds $10^{0}\,\Omega\cdot cm^2$.

These results are summarized and shown in Tables 3 and 4.

TABLE 3

| No. | Composition (Second Layer (X)/ First Layer (Y)) | Film Thickness (nm) X/Y | Heat Treatment Temperature (° C.) | Presence or Absence of Enriched Layer | Adhesion to Insulating Film Kind | Adhesion to Insulating Film Evaluation |
|---|---|---|---|---|---|---|
| 1 | Pure-Cu | 300 | — | X | $SiO_2$ | X |
| 2 | Pure-Cu/Cu—2 at % Mn | 250/50 | 350 | ○ | $SiO_2$ | ○ |
| 3 | Pure-Cu/Cu—2 at % Mn | 280/20 | 350 | ○ | $SiO_2$ | ○ |
| 4 | Pure-Cu/Cu—4 at % Mn | 280/20 | 350 | ○ | $SiO_2$ | ○ |
| 5 | Pure-Cu/Cu—10 at % Mn | 290/10 | 250 | ○ | $SiO_2$ | ○ |
| 6 | Pure-Cu/Cu—10 at % Mn | 290/10 | 350 | ○ | $SiO_2$ | ○ |
| 7 | Pure-Cu/Cu—20 at % Mn | 290/10 | 350 | ○ | $SiO_2$ | ○ |
| 8 | Pure-Cu/Cu—10 at % Mn | 290/10 | 350 | ○ | SiON | ○ |
| 9 | Pure-Cu/Cu—10 at % Al | 280/20 | 350 | ○ | $SiO_2$ | ○ |
| 10 | Pure-Cu/Cu—10 at % Ti | 280/20 | 350 | ○ | $SiO_2$ | ○ |
| 11 | Pure-Cu/Cu—10 at % Ni | 280/20 | 350 | ○ | $SiO_2$ | ○ |
| 12 | Pure-Cu/Cu—10 at % Zn | 280/20 | 350 | ○ | $SiO_2$ | ○ |
| 13 | Pure-Cu/Cu—10 at % Mg | 280/20 | 350 | ○ | $SiO_2$ | ○ |
| 14 | Pure-Cu/Cu—10 at % Ca | 280/20 | 350 | ○ | $SiO_2$ | ○ |
| 15 | Pure-Cu/Cu—10 at % Nb | 280/20 | 350 | ○ | $SiO_2$ | ○ |
| 16 | Pure-Cu/Cu—10 at % W | 280/20 | 350 | ○ | $SiO_2$ | ○ |
| 17 | Pure-Cu/Cu—4 at % Al | 280/20 | 350 | ○ | $SiO_2$ | ○ |
| 18 | Pure-Cu/Cu—4 at % Ti | 280/20 | 350 | ○ | $SiO_2$ | ○ |
| 19 | Pure-Cu/Cu—4 at % Ni | 280/20 | 350 | ○ | $SiO_2$ | ○ |
| 20 | Pure-Cu/Cu—4 at % Zn | 280/20 | 350 | ○ | $SiO_2$ | ○ |
| 21 | Pure-Cu/Cu—4 at % Mg | 280/20 | 350 | ○ | $SiO_2$ | ○ |
| 22 | Pure-Cu/Cu—4 at % Ca | 280/20 | 350 | ○ | $SiO_2$ | ○ |
| 23 | Pure-Cu/Cu—4 at % Nb | 280/20 | 350 | ○ | $SiO_2$ | ○ |
| 24 | Pure-Cu/Cu—4 at % W | 280/20 | 350 | ○ | $SiO_2$ | ○ |
| 25 | Pure-Cu/Cu—20 at % Al | 280/20 | 350 | ○ | $SiO_2$ | ○ |
| 26 | Pure-Cu/Cu—20 at % Ti | 280/20 | 350 | ○ | $SiO_2$ | ○ |
| 27 | Pure-Cu/Cu—20 at % Ni | 280/20 | 350 | ○ | $SiO_2$ | ○ |
| 28 | Pure-Cu/Cu—20 at % Zn | 280/20 | 350 | ○ | $SiO_2$ | ○ |
| 29 | Pure-Cu/Cu—20 at % Mg | 280/20 | 350 | ○ | $SiO_2$ | ○ |
| 30 | Pure-Cu/Cu—20 at % Ca | 280/20 | 350 | ○ | $SiO_2$ | ○ |
| 31 | Pure-Cu/Cu—20 at % Nb | 280/20 | 350 | ○ | $SiO_2$ | ○ |
| 32 | Pure-Cu/Cu—20 at % W | 280/20 | 350 | ○ | $SiO_2$ | ○ |
| 33 | Cu—0.3Ni/Cu—10 at % Mn | 280/20 | 350 | ○ | $SiO_2$ | ○ |
| 34 | Cu—0.3Zn/Cu—10 at % Mn | 280/20 | 350 | ○ | $SiO_2$ | ○ |
| 35 | Cu—0.3Ca/Cu—10 at % Mn | 280/20 | 350 | ○ | $SiO_2$ | ○ |
| 36 | Cu—0.3 Mg/Cu—10 at % Mn | 280/20 | 350 | ○ | $SiO_2$ | ○ |

*: The reminder: Cu and inevitable impurities

TABLE 4

| No. | Contact Resistivity with IGZO (1/1/1) | Contact Resistivity with IGZO (2/2/1) | Contact Resistivity with ZTO (2/1) | Contact Resistivity with ITO | Contact Resistivity with IZO |
|---|---|---|---|---|---|
| 1 | ○ | ○ | ○ | ○ | ○ |
| 2 | ○ | ○ | ○ | ○ | ○ |
| 3 | ○ | ○ | ○ | ○ | ○ |
| 4 | ○ | ○ | ○ | ○ | ○ |
| 5 | ○ | ○ | ○ | ○ | ○ |
| 6 | ○ | ○ | ○ | ○ | ○ |
| 7 | ○ | ○ | ○ | ○ | ○ |
| 8 | ○ | ○ | ○ | ○ | ○ |
| 9 | ○ | ○ | ○ | ○ | ○ |
| 10 | ○ | ○ | ○ | ○ | ○ |
| 11 | ○ | ○ | ○ | ○ | ○ |
| 12 | ○ | ○ | ○ | ○ | ○ |
| 13 | ○ | ○ | ○ | ○ | ○ |
| 14 | ○ | ○ | ○ | ○ | ○ |
| 15 | ○ | ○ | ○ | ○ | ○ |
| 16 | ○ | ○ | ○ | ○ | ○ |
| 17 | ○ | ○ | ○ | ○ | ○ |
| 18 | ○ | ○ | ○ | ○ | ○ |
| 19 | ○ | ○ | ○ | ○ | ○ |

TABLE 4-continued

| No. | Contact Resistivity with IGZO (1/1/1) | Contact Resistivity with IGZO (2/2/1) | Contact Resistivity with ZTO (2/1) | Contact Resistivity with ITO | Contact Resistivity with IZO |
|---|---|---|---|---|---|
| 20 | ○ | ○ | ○ | ○ | ○ |
| 21 | ○ | ○ | ○ | ○ | ○ |
| 22 | ○ | ○ | ○ | ○ | ○ |
| 23 | ○ | ○ | ○ | ○ | ○ |
| 24 | ○ | ○ | ○ | ○ | ○ |
| 25 | ○ | ○ | ○ | ○ | ○ |
| 26 | ○ | ○ | ○ | ○ | ○ |
| 27 | ○ | ○ | ○ | ○ | ○ |
| 28 | ○ | ○ | ○ | ○ | ○ |
| 29 | ○ | ○ | ○ | ○ | ○ |
| 30 | ○ | ○ | ○ | ○ | ○ |
| 31 | ○ | ○ | ○ | ○ | ○ |
| 32 | ○ | ○ | ○ | ○ | ○ |
| 33 | ○ | ○ | ○ | ○ | ○ |
| 34 | ○ | ○ | ○ | ○ | ○ |
| 35 | ○ | ○ | ○ | ○ | ○ |
| 36 | ○ | ○ | ○ | ○ | ○ |

From Tables 3 and 4, the following consideration can be made.

First of all, as shown in Table 3, with respect to the adhesion to the insulating film, as compared with the pure Cu film (No. 1), all of Nos. 2 to 36 (Example) using a laminated Cu alloy film specified in the invention were enhanced in the adhesion to the insulating film. In detail, it may be considered that by depositing a Cu alloy film and then performing the heat treatment at 250° C. or higher, the alloying element was diffused in the vicinity of the insulating film, and therefore, the adhesion to the insulating film was enhanced. Such high adhesion to the insulating film was also confirmed when any of silicon oxide or silicon oxynitride was used.

Furthermore, as shown in Table 4, in all of the foregoing examples of the invention, the contact resistance with each of IGZO, ZTO, ITO, and IZO was suppressed in a low level similar to the case of pure Cu. Also, while not shown in the table, the electrical resistivity of each of the foregoing examples of the invention (interconnection resistance of the Cu alloy film itself) was low in the same degree as that in pure Cu (in general, from about 2.1 to 2.5 μΩ·cm).

According to the foregoing results, by using the laminated Cu alloy film specified in the invention, an interconnection structure having excellent adhesion to an insulating film could be provided even without intervening a barrier metal layer of a high melting point metal as in the conventional art, while keeping a low electrical resistivity which is original to Cu and low contact resistance with an oxide semiconductor or a conductive oxidized film constituting a pixel electrode.

Example 2-2

In this Example, it is demonstrated that the contact resistance between the Cu alloy film and the oxide semiconductor varies depending upon the heating temperature after depositing the Cu alloy, and scattering is caused in the measured value; and that therefore, in order to surely suppress the foregoing contact resistance in a low level with good reproducibility, it is effective to control the heating temperature within a prescribed range.

First of all, the contact resistance with each of oxide semiconductors (IGZO (In/Ga/Zn (atomic ratio) of 1/1/1 or 2/2/1) and ZTO (Zn/Sn (atomic ratio) of 2/1)) was measured in the same manner as that in Example 2-1, except that a sample having the same composition as that of Nos. 5 and 6 of the above-described Table 3 (a laminated Cu alloy film of pure Cu-10 at % Mn, as specified in the invention) was used; and that the heat treatment temperature after forming the electrode pattern shown in FIG. 10 was controlled in each of various ranges shown in Table 5. The measurement was performed 5 times in total, and an average value thereof was calculated. Whether the contact resistance with the oxide semiconductor was good or bad was evaluated according to the same criteria as those in Example 2-1, and ○ was accepted. In Example 2-1, whether the contact resistance with the oxide semiconductor at the measurement number of one (n=1) is good or bad is decided. On the other hand, in this Example, whether the contact resistance with the oxide semiconductor at the measurement number of five (average value of n=5) is good or bad is decided, and only ○ is strictly decided to be accepted; and therefore, this point of issue is different from the former.

These results are shown in Table 5.

TABLE 5

| No. | Composition | Film Thickness (nm) | Heat Treatment Temperature (° C.) | Contact Resistivity with IGZO (1/1/1) | Contact Resistivity with IGZO (2/2/1) | Contact Resistivity with ZTO (2/1) |
|---|---|---|---|---|---|---|
| 1 | Pure-Cu/Cu—10 at % Mn | 290/10 | 200 | X | X | X |
| 2 | | | 250 | Δ | Δ | Δ |
| 3 | | | 300 | Δ | Δ | Δ |
| 4 | | | 350 | ○ | ○ | ○ |
| 5 | | | 400 | ○ | ○ | ○ |

*: The reminder: Cu and inevitable impurities

It was shown from Table 5 that so far as the heating temperature after depositing the Cu alloy film is controlled to a temperature exceeding 300° C., even when the measurement number is increased, the low contact resistance with IGZO can be surely achieved, whereas when the heating temperature is 300° C. or lower, scattering is found in the measured value of the contact resistance, and reproducibility is poor. While not shown in Table 5, even when the heating temperature was increased to about 450° C. as an upper limit to be used in a process step of usual flat panel displays, the low contact resistance with IGZO could be kept.

Here, No. 5 (heat treatment temperature: 250° C.) and No. 6 (heat treatment temperature: 350° C.) of the above-described Table 3 have the same composition as that in the Cu alloy film used in this Example. As shown in Table 4, the contact resistance with IGZO at the measurement number of one was ○ in all of the cases, and a significant difference was not found; whereas when the measurement number was increased as in this Example, a significant difference was found, the contact resistance was Δ at a heat treatment temperature of 250° C. (No. 2 of Table 5), and the contact resistance was ○ at a heat treatment temperature of 350° C. (No. 4 of Table 5).

From the foregoing results, it was shown that in order to surely ensure the low contact resistance between the Cu alloy film and IGZO with good reproducibility, in general, it is effective to control the heating temperature after depositing the Cu alloy film to higher than 300° C. and 450° C. or lower.

Example 3-1

In this Example, by using each of samples formed by the following method, adhesion to an insulating film on a substrate (in this Example, a silicon oxide film or a silicon oxynitride was formed while imitating a gate insulating film), contact resistance with an oxide semiconductor (IGZO or ZTO), and contact resistance with a transparent conductive film (ITO or IZO) were measured.
(Preparation of Sample)

First of all, a glass substrate (Eagle 2000, manufactured by Corning Incorporated, size: 50.8 mm in diameter×0.7 mm in thickness) was prepared, followed by subjecting to plasma CVD, thereby depositing a silicon oxide film or a silicon oxynitride film (all of these films had a film thickness of 300 nm). For the deposition of the silicon oxide film, a silane gas and $N_2O$ were used, whereas for the deposition of the silicon oxynitride film, a silane gas and an ammonia gas were used.

Subsequently, each of various Cu alloy films shown in Table 6 (the total film thickness was 300 nm and constant) was deposited on the foregoing insulating film by the DC magnetron sputtering method. In detail, a trade name of "HSM-552", manufactured by Shimadzu Corporation was used as a sputtering apparatus, and the each of various Cu alloy film was deposited on the silicon oxide film or silicon oxynitride film by the DC magnetron sputtering method [back pressure: $0.27 \times 10^{-3}$ Pa or less, atmosphere gas: Ar, Ar gas pressure: 2 mTorr, Ar gas flow rate: 30 sccm, sputter power: DC260W, distance between electrodes: 50.4 mm, substrate temperature: 25° C. (room temperature)], thereby obtaining a sample of a interconnection film.

For the formation of the pure Cu film, pure Cu was used as a sputtering target. Also, for the formation of the Cu alloy film of various alloy components, a sputtering target formed by the vacuum melting method was used.

A composition of the above-deposited Cu alloy film was confirmed through quantitative analysis using an ICP emission spectrometer (ICP emission spectrometer "ICP-8000 Model", manufactured by Shimadzu Corporation).

For comparison, a sample composed of only pure Cu (No. 1 in Table 6) was prepared.
(Test of Adhesion to Insulating Film)

Each of the above-obtained samples was subjected to various heat treatments described in Table 6. In detail, the heat treatment was performed within a CVD apparatus in vacuo at 350° C. or 250° C. for 5 minutes.

The adhesion of each sample after the heat treatment was evaluated by a peeling test with a tape on the basis of the tape peeling test according to the JIS standards. In detail, crosscuts (cross-cuts of 5×5) were provided at intervals of 1 mm on the surface of each sample by using a cutter knife. Subsequently, a black polyester tape, manufactured by Sumitomo 3M Limited (product No.: 8422B) was firmly stuck onto the foregoing surface; the tape was peeled off at once while keeping a peeling angle of the tape at 60°; the number of divisions of cross-cuts which had not been peeled off by the tape was counted; and a ratio to all of the divisions (film retention ratio) was determined. The measurement was performed three times, and an average value of those in the measurement of three times was defined as a film retention ratio of each sample.

In this Example, the case where the peeling ratio by tape is 0% or more and less than 10% was decided as "○", and the case where the peeling ratio by tape is 10% or more was decided as "x"; and ○ (the adhesion to the silicon oxide film was good) was accepted.
(Presence or Absence of Enriched Layer at an Interface Between Insulating Film and Cu Alloy Film)

Prior to performing the foregoing adhesion test, whether or not an enriched layer was formed in each sample was confirmed. In detail, in each sample, it was confirmed by a TEM image and an EDX line analysis of an interface that the enriched layer was formed at the interface with the substrate.

In this Example, the case where the enriched layer could be confirmed was decided as "○", and the case where the enriched layer could not be confirmed was decided as "x"; and ○ (the enriched layer was formed) was accepted.
(Measurement of Contact Resistance with IGZO)

Each of the above-obtained samples was successively subjected to photolithography and etching, thereby forming an electrode pattern shown in FIG. 10, followed by subjecting to various heat treatments described in Table 6. In detail, the heat treatment was performed within a CVD apparatus in vacuo at 350° C. or 250° C. for 5 minutes.

Subsequently, an IGZO film (oxide semiconductor) was deposited under the following condition by the sputtering method, followed by subjecting to photolithography and patterning, thereby forming a contact chain pattern in which 100 contact parts of 80 μm square were connected in series (see FIG. 10). In FIG. 10, a line width of each of the Cu alloy and IGZO is 80 μm. Sputtering targets of IGZO having a composition of In/Ga/Zn of 1/1/1 and 2/2/1, respectively were used.
(Deposition Condition of Oxide Semiconductor)

Atmosphere gas: Argon
Pressure: 5 mTorr
Substrate temperature: 25° C. (room temperature)
Film thickness: 100 nm A probe was brought into contact with a pad disposed in each of the both ends of the foregoing contact chain pattern, a voltage of from −0.1 V to +1.0 V was applied using an HP4156A semiconductor parameter analyzer, and I-V properties were measured by means of two-probe measurement, thereby determining contact chain resistance. Furthermore, by imitating the heat treatment during depositing a protective layer, a heat treatment was performed in a vacuum atmosphere at 250° C., 300° C., or 350° C. for 30 minutes by using a CVD apparatus (see Table 6), and contact chain resistance after the heat treatment was measured.

Then, a contact resistance value per contact was calculated and converted per unit area, thereby determining a contact resistivity with IGZO. Whether the contact resistance with IGZO was good or bad was decided according to the following criteria. In this Example, ○ or Δ was accepted.

○: The contact resistivity is less than $10^{-2} \Omega \cdot cm^2$.
Δ: The contact resistivity is $10^{-2} \Omega \cdot cm^2$ or more and $10^0 \Omega \cdot cm^2$ or less.
x: The contact resistivity exceeds $10^0 \Omega \cdot cm^2$.
(Measurement of Contact Resistance with ZTO)

Each of the above-obtained samples was successively subjected to photolithography and etching, thereby forming an electrode pattern shown in FIG. 10, followed by subjecting to various heat treatments described in Table 6. In detail, the heat treatment was performed within a CVD apparatus in vacuo at 350° C. or 250° C. for 5 minutes.

Subsequently, a ZTO film (oxide semiconductor) was deposited under the following condition by the sputtering method, followed by subjecting to photolithography and patterning, thereby forming a contact chain pattern in which 100 contact parts of 80 μm square were connected in series (see FIG. 10). In FIG. 10, a line width of each of the Cu alloy and ZTO is 80 μm. A sputtering target of ZTO having a composition of Zn/Sn of 2/1 was used.
(Deposition Condition of Oxide Semiconductor)
  Atmosphere gas: Argon
  Pressure: 5 mTorr
  Substrate temperature: 25° C. (room temperature)
  Film thickness: 100 nm A probe was brought into contact with a pad disposed in each of the both ends of the foregoing contact chain pattern, a voltage of from −0.1 V to +1.0 V was applied using an HP4156A semiconductor parameter analyzer, and I-V properties were measured by means of two-probe measurement, thereby determining contact chain resistance. Furthermore, by imitating the heat treatment during depositing a protective layer, a heat treatment was performed in a vacuum atmosphere at 250° C., 300° C., or 350° C. for 30 minutes by using a CVD apparatus (see Table 6), and contact chain resistance after the heat treatment was measured.

Then, a contact resistance value per contact was calculated and converted per unit area, thereby determining a contact resistivity with IGZO. Whether the contact resistance with ZTO was good or bad was decided according to the following criteria. In this Example, ○ or Δ was accepted.
  ○: The contact resistivity is less than $10^{-2} \Omega \cdot cm^2$.
  Δ: The contact resistivity is $10^{-2} \Omega \cdot cm^2$ or more and $10^0 \Omega \cdot cm^2$ or less.
  x: The contact resistivity exceeds $10^0 \Omega \cdot cm^2$.
(Contact Resistance with ITO)

Each of the above-deposited Cu alloy films was successively subjected to photolithography and etching, thereby forming an electrode pattern shown in FIG. 9. Subsequently, a silicon nitride ($SiN_x$) film having a film thickness of 300 nm was formed by a CVD apparatus. At that time, the deposition was performed at a temperature of 250° C. or 320° C. as shown in Table 6. Also, the deposition time is 15 minutes in all of the cases. The alloying element was deposited as a deposit by a heat history at this time. Subsequently, photolithography and etching by an RIE (Reactive Ion Etching) apparatus were performed, thereby forming a contact hole on the SiN film.

Subsequently, an ITO film (transparent conductive film) was deposited under the following condition by the sputtering method, followed by subjecting to photolithography and patterning, thereby forming a contact chain pattern in which 50 contact parts of 10 μm square were connected in series (see FIG. 9). In FIG. 9, a line width of each of the Cu alloy and ITO is 80 μm.
(Deposition Condition of ITO Film)
  Atmosphere gas: Argon
  Pressure: 0.8 mTorr
  Substrate temperature: 25° C. (room temperature)
  Film thickness: 200 nm Total resistance (contact resistance and connection resistance) of the foregoing contact chain was determined by bringing a probe into contact with each of pad parts of the both ends of the contact chain pattern by using HEWLETT PACKARD 4156A and Precision Semiconductor Parameter Analyzer of Agilent Technologies 4156C and measuring I-V properties by means of two-probe measurement. Then, a contact resistance value as converted into single contact was determined, and whether the direct contact resistance with ITO (contact resistance with ITO) was good or bad was decided according to the following criteria. In this Example, ○ or Δ was accepted.
(Criteria of Judgment)
  ○: The contact resistivity is less than $10^{-2} \Omega \cdot cm^2$.
  Δ: The contact resistivity is $10^{-2} \Omega \cdot cm^2$ or more and $10^0 \Omega \cdot cm^2$ or less.
  x: The contact resistivity exceeds $10^0 \Omega \cdot cm^2$.
(Contact Resistance with IZO)

Similar to the foregoing ITO, each of the above-deposited Cu alloy films was successively subjected to photolithography and etching, thereby forming an electrode pattern shown in FIG. 9 and also forming a silicon nitride ($SiN_x$) film. At that time, the alloying element was deposited as a deposit by a heat history. Subsequently, a contact hole was formed on the silicon nitride film, and IZO (transparent conductive film) was deposited under the following condition by the sputtering method, followed by subjecting to photolithography and patterning, thereby forming a contact chain pattern in which 50 contact parts of 10 μm square were connected in series (see FIG. 9). In FIG. 9, a line width of each of the Cu alloy and IZO is 80 μm.
(Deposition Condition of IZO Film)
  Atmosphere gas: Argon
  Pressure: 0.8 mTorr
  Substrate temperature: 25° C. (room temperature)
  Film thickness: 200 nm Total resistance (contact resistance and connection resistance) of the foregoing contact chain was determined in the same manner as that in the foregoing ITO film. Then, a contact resistance value as converted into single contact was determined, and whether the direct contact resistance with IZO (contact resistance with IZO) was good or bad was decided according to the following criteria. In this Example, ○ or Δ was accepted.
(Criteria of Judgment)
  ○: The contact resistivity is less than $10^{-2} \Omega \cdot cm^2$.
  Δ: The contact resistivity is $10^{-2} \Omega \cdot cm^2$ or more and $10^0 \Omega \cdot cm^2$ or less.
  x: The contact resistivity exceeds $10^0 \Omega \cdot cm^2$.

These results are summarized and shown in Table 6.

TABLE 6

| No. | Composition | Film Thickness (nm) | Heat Treatment Temperature (° C.) | Contact Resistivity with IGZO (1/1/1) | Contact Resistivity with IGZO (2/2/1) | Contact Resistivity with ZTO | Contact Resistivity with ITO | Contact Resistivity with IZO | Presence of Absence of Enriched Layer | Adhesion to Insulation Film Kind | Adhesion to Insulation Film Evaluation |
|---|---|---|---|---|---|---|---|---|---|---|---|
| 1 | Pure—Cu | 300 | — | ○ | ○ | ○ | ○ | ○ | X | SiO$_2$ | X |
| 2 | Cu—0.3 at % Mn | 300 | — | ○ | ○ | ○ | ○ | ○ | X | SiO$_2$ | X |
| 3 | Cu—0.3 at % Mn | 300 | 350 | ○ | ○ | ○ | ○ | ○ | X | SiO$_2$ | X |
| 4 | Cu—1 at % Mn | 300 | — | ○ | ○ | ○ | ○ | ○ | X | SiO$_2$ | X |
| 5 | Cu—1 at % Mn | 300 | 350 | ○ | ○ | ○ | ○ | ○ | ○ | SiO$_2$ | ○ |
| 6 | Cu—2 at % Mn | 300 | 350 | ○ | ○ | ○ | ○ | ○ | ○ | SiO$_2$ | ○ |

TABLE 6-continued

| No. | Composition | Film Thickness (nm) | Heat Treatment Temperature (° C.) | Contact Resistivity with IGZO (1/1/1) | Contact Resistivity with IGZO (2/2/1) | Contact Resistivity with ZTO | Contact Resistivity with ITO | Contact Resistivity with IZO | Presence of Absence of Enriched Layer | Adhesion to Insulation Film Kind | Evaluation |
|---|---|---|---|---|---|---|---|---|---|---|---|
| 7 | Cu—2 at % Mn | 300 | 350 | ○ | ○ | ○ | ○ | ○ | ○ | SiON | ○ |
| 8 | Cu—2 at % Mn | 300 | 250 | ○ | ○ | ○ | ○ | ○ | ○ | SiO$_2$ | ○ |
| 9 | Cu—2 at % Al | 300 | 350 | ○ | ○ | ○ | ○ | ○ | ○ | SiO$_2$ | ○ |
| 10 | Cu—2 at % Mg | 300 | 350 | ○ | ○ | ○ | ○ | ○ | ○ | SiO$_2$ | ○ |
| 11 | Cu—2 at % Ti | 300 | 350 | ○ | ○ | ○ | ○ | ○ | ○ | SiO$_2$ | ○ |
| 12 | Cu—2 at % Ca | 300 | 350 | ○ | ○ | ○ | ○ | ○ | ○ | SiO$_2$ | ○ |
| 13 | Cu—2 at % W | 300 | 350 | ○ | ○ | ○ | ○ | ○ | ○ | SiO$_2$ | ○ |
| 14 | Cu—2 at % Nb | 300 | 350 | ○ | ○ | ○ | ○ | ○ | ○ | SiO$_2$ | ○ |
| 15 | Cu—2 at % Ni | 300 | 350 | ○ | ○ | ○ | ○ | ○ | ○ | SiO$_2$ | ○ |
| 16 | Cu—2 at % Zn | 300 | 350 | ○ | ○ | ○ | ○ | ○ | ○ | SiO$_2$ | ○ |
| 17 | Cu—4 at % Mn | 300 | 350 | ○ | ○ | ○ | ○ | ○ | ○ | SiO$_2$ | ○ |
| 18 | Cu—10 at % Mn | 300 | 350 | ○ | ○ | ○ | ○ | ○ | ○ | SiO$_2$ | ○ |
| 19 | Cu—1 at % Mn—0.5 at % B | 300 | 350 | ○ | ○ | ○ | ○ | ○ | ○ | SiO$_2$ | ○ |
| 20 | Cu—1 at % Mn—0.5 at % Ag | 300 | 350 | ○ | ○ | ○ | ○ | ○ | ○ | SiO$_2$ | ○ |
| 21 | Cu—1 at % Mn—0.5 at % C | 300 | 350 | ○ | ○ | ○ | ○ | ○ | ○ | SiO$_2$ | ○ |
| 22 | Cu—1 at % Mn—0.5 at % W | 300 | 350 | ○ | ○ | ○ | ○ | ○ | ○ | SiO$_2$ | ○ |
| 23 | Cu—1 at % Mn—0.5 at % Ca | 300 | 350 | ○ | ○ | ○ | ○ | ○ | ○ | SiO$_2$ | ○ |
| 24 | Cu—1 at % Mn—0.5 at % Mg | 300 | 350 | ○ | ○ | ○ | ○ | ○ | ○ | SiO$_2$ | ○ |

*: The reminder: Cu and inevitable impurities

From Table 6, the following consideration can be made,

First of all, with respect to the adhesion to the insulating film, all of the samples (Example) using the Cu—X1 alloy film (Nos. 5 to 18) or the Cu—X1-X2 alloy film (Nos. 19 to 24) as specified in the invention are those having been subjected to a heat treatment at 250° C. or higher and were enhanced in the adhesion to the insulating film, as compared with the pure Cu film (No. 1). In detail, it may be considered that by depositing a Cu alloy film and then performing the heat treatment at 250° C. or higher, the alloying element was diffused in the vicinity of the insulating film, and therefore, the adhesion to the insulating film was enhanced. Such high adhesion to the insulating film was also confirmed when any of SiO$_2$ or SiON was used.

Of these, in an example of using Mn as the alloying element, the formation of a Cu—Mn reaction layer at the interface with the insulating film was confirmed (not shown), and it may be considered that this reaction layer deeply contributed to an enhancement of the adhesion.

Furthermore, as shown in Table 6, in all of the foregoing examples of the invention, the contact resistance with each of IGZO, ZTO, ITO, and IZO was suppressed in a low level similar to the case of pure Cu. Also, while not shown in the table, the electrical resistivity of each of the foregoing examples of the invention (interconnection resistance of the Cu alloy film itself) was in general from about 2.5 to 3.5 μΩ·cm.

On the other hand, in No. 2 (without a heat treatment) and No. 3 (with a heat treatment) in which the amount of Mn is small, the adhesion to the insulating film was lowered similar to the case of the pure Cu film (No. 1). Also, in No. 4, since the heat treatment was not applied, the adhesion was lowered.

According to the foregoing results, by using the Cu alloy film specified in the invention, an interconnection structure having excellent adhesion to an insulating film could be provided even without intervening a barrier metal layer of a high melting point metal as in the conventional art, while keeping a low electrical resistivity which is original to Cu and low contact resistance with an oxide semiconductor or a conductive oxidized film constituting a pixel electrode.

Example 4-1

In this Example, by using each of samples formed by the following method, contact resistance with each of an oxide semiconductor (IGZO or ZTO) and a transparent conductive film (ITO or IZO) was measured. In particular, in this Example, it is demonstrated that the contact resistance between the Cu film and the oxide semiconductor varies depending upon the heating temperature after depositing Cu, and scattering is caused in the measured value; and that therefore, in order to surely suppress the foregoing contact resistance in a low level with good reproducibility, it is effective to control the heating temperature within a prescribed range. Also, it is demonstrated that the contact resistance with the transparent conductive film does not greatly vary by the heating temperature after depositing Cu as in the case of the oxide semiconductor.

(Preparation of Sample)

First of all, a glass substrate (Eagle 2000, manufactured by Corning Incorporated, size: 50.8 mm in diameter×0.7 mm in thickness) was prepared, followed by subjecting to plasma CVD, thereby depositing a silicon oxide film (film thickness: 300 nm). For the deposition of the silicon oxide film, a silane gas and N$_2$O were used.

Subsequently, Mo was used a sputtering target, and an Mo film (film thickness: 20 nm) was deposited on the foregoing insulating film by the DC magnetron sputtering method. In detail, a trade name of "HSM-552", manufactured by Shimadzu Corporation was used as a sputtering apparatus, Mo was deposited by the DC magnetron sputtering method [back pressure: 0.27×10$^{-3}$ Pa or less, atmosphere gas: Ar, Ar gas pressure: 2 mTorr, Ar gas flow rate: 30 sccm, sputter power: DC260W, distance between electrodes: 50.4 mm, substrate temperature: 25° C. (room temperature)], and a pure Cu film was then deposited thereon, thereby obtaining a sample. For the formation of the pure Cu film, pure Cu was used as a sputtering target.

(Measurement of Contact Resistance with IGZO)

Each of the above-obtained samples was successively subjected to photolithography and etching, thereby forming an electrode pattern shown in FIG. 10, followed by subjecting to various heat treatments described in Table 7 within a CVD apparatus in vacuo. The heating time was 5 minutes in all of the cases.

Subsequently, an IGZO film (oxide semiconductor) was deposited under the following condition by the sputtering method, followed by subjecting to photolithography and patterning, thereby forming a contact chain pattern in which 100 contact parts of 80 µm square were connected in series (see FIG. 10). In FIG. 10, a line width of each of Cu and IGZO is 80 µm. Sputtering targets of IGZO having a composition of In/Ga/Zn of 1/1/1 and 2/2/1, respectively were used.

(Deposition Condition of Oxide Semiconductor)
    Atmosphere gas: Argon
    Pressure: 5 mTorr
    Substrate temperature: 25° C. (room temperature)
    Film thickness: 100 nm A probe was brought into contact with a pad disposed in each of the both ends of the foregoing contact chain pattern, a voltage of from −0.1 V to +1.0 V was applied using an HP4156A semiconductor analyzer, and I-V properties were measured by means of two-probe measurement, thereby determining contact chain resistance.

Then, a contact resistance value per contact was calculated and converted per unit area, thereby determining a contact resistivity with IGZO. The measurement was performed 5 times, and an average value thereof was calculated. Whether the contact resistance with IGZO was good or bad was decided according to the following criteria, and ○ was accepted.
    ○: The contact resistivity is less than $10^{-2} \Omega \cdot cm^2$.
    Δ: The contact resistivity is $10^{-2} \Omega \cdot cm^2$ or more and $10^0 \Omega \cdot cm^2$ or less.
    x: The contact resistivity exceeds $10^0 \Omega \cdot cm^2$.

(Measurement of Contact Resistance with ZTO)

Each of the above-obtained samples was successively subjected to photolithography and etching, thereby forming an electrode pattern shown in FIG. 10, followed by subjecting to various heat treatments described in Table 7 within a CVD apparatus in vacuo. The heating time was 5 minutes in all of the cases.

Subsequently, a ZTO film (oxide semiconductor) was deposited under the following condition by the sputtering method, followed by subjecting to photolithography and patterning, thereby forming a contact chain pattern in which 100 contact parts of 80 µm square were connected in series (see FIG. 10). In FIG. 10, a line width of each of Cu and ZTO is 80 µm. A sputtering target of ZTO having a composition of Zn/Sn of 2/1 was used.

(Deposition Condition of Oxide Semiconductor)
    Atmosphere gas: Argon
    Pressure: 5 mTorr
    Substrate temperature: 25° C. (room temperature)
    Film thickness: 100 nm A probe was brought into contact with a pad disposed in each of the both ends of the foregoing contact chain pattern, a voltage of from −0.1 V to +1.0 V was applied using an HP4156A semiconductor parameter analyzer, and I-V properties were measured by means of two-probe measurement, thereby determining contact chain resistance.

Then, a contact resistance value per contact was calculated and converted per unit area, thereby determining a contact resistivity with ZTO. The measurement was performed 5 times, and an average value thereof was calculated. Whether the contact resistance with ZTO was good or bad was decided according to the following criteria. In this Example, ○ was accepted.
    ○: The contact resistivity is less than $10^{-2} \Omega \cdot cm^2$.
    Δ: The contact resistivity is $10^{-2} \Omega \cdot cm^2$ or more and $10^0 \Omega \cdot cm^2$ or less.
    x: The contact resistivity exceeds $10^0 \Omega \cdot cm^2$.

(Contact Resistance with ITO)

The above-deposited pure Cu film was successively subjected to photolithography and etching, thereby forming an electrode pattern shown in FIG. 9. Subsequently, a silicon nitride ($SiN_x$) film having a film thickness of 300 nm was formed by a CVD apparatus. At that time, the deposition was performed at a temperature of from 200 to 400° C. as shown in Table 7. Also, the deposition time is 15 minutes in all of the cases. Subsequently, photolithography and etching by an RIE (Reactive Ion Etching) apparatus were performed, thereby forming a contact hole on the silicon nitride film.

Subsequently, an ITO film (transparent conductive film) was deposited under the following condition by the sputtering method, followed by subjecting to photolithography and patterning, thereby forming a contact chain pattern in which 50 contact parts of 10 µm square were connected in series (see FIG. 9). In FIG. 9, a line width of each of the Cu alloy and ITO is 80 µm.

(Deposition Condition of ITO Film)
    Atmosphere gas: Argon
    Pressure: 0.8 mTorr
    Substrate temperature: 25° C. (room temperature)
    Film thickness: 200 nm Total resistance (contact resistance and connection resistance) of the foregoing contact chain was determined by bringing a probe into contact with each of pad parts of the both ends of the contact chain pattern by using HEWLETT PACKARD 4156A and Precision Semiconductor Parameter Analyzer of Agilent Technologies 4156C and measuring I-V properties by means of two-probe measurement. Then, a contact resistance value as converted into single contact was determined, and whether the direct contact resistance with ITO (contact resistance with ITO) was good or bad was decided according to the following criteria. In this Example, ○ or Δ was accepted.

(Criteria of Judgment)
    ○: The contact resistivity is less than $10^{-2} \Omega \cdot cm^2$.
    Δ: The contact resistivity is $10^{-2} \Omega \cdot cm^2$ or more and $10^0 \Omega \cdot cm^2$ or less.
    x: The contact resistivity exceeds $10^0 \Omega \cdot cm^2$.

(Contact Resistance with IZO)

Similar to the foregoing ITO, the deposited pure Cu film was successively subjected to photolithography and etching, thereby forming an electrode pattern shown in FIG. 9 and also forming a silicon nitride ($SiN_x$) film. Subsequently, a contact hole was formed on the silicon nitride film, and IZO (transparent conductive film) was deposited under the following condition by the sputtering method, followed by subjecting to photolithography and patterning, thereby forming a contact chain pattern in which 50 contact parts of 10 µm square were connected in series (see FIG. 9). In FIG. 9, a line width of each of the Cu alloy and IZO is 80 µm.

(Deposition Condition of IZO Film)
    Atmosphere gas: Argon
    Pressure: 0.8 mTorr
    Substrate temperature: 25° C. (room temperature)
    Film thickness: 200 nm Total resistance (contact resistance and connection resistance) of the foregoing contact chain was determined in the same manner as that in the foregoing ITO film. Then, a contact resistance value as converted into single contact was determined, and whether the direct contact resistance with IZO (contact resistance with IZO) was good or bad was decided according to the following criteria. In this Example, ○ or Δ was accepted.
(Criteria of Judgment)
○: The contact resistivity is less than $10^{-2} \Omega \cdot cm^2$.
Δ: The contact resistivity is $10^{-2} \Omega \cdot cm^2$ or more and $10^0 \Omega \cdot cm^2$ or less.
x: The contact resistivity exceeds $10^0 \Omega \cdot cm^2$.
These results are summarized and shown in Table 5.

TABLE 7

| No. | Composition | Film Thickness (nm) | Heat Treatment Temperature (°C.) | Contact Resistivity with IGZO (1/1/1) | Contact Resistivity with IGZO (2/2/1) | Contact Resistivity with ZTO | Contact Resistivity with ITO | Contact Resistivity with IZO |
|---|---|---|---|---|---|---|---|---|
| 1 | Pure-Cu/Mo | 280/20 | 200 | X | X | X | ○ | ○ |
| 2 | | | 250 | Δ | Δ | Δ | ○ | ○ |
| 3 | | | 300 | Δ | Δ | Δ | ○ | ○ |
| 4 | | | 350 | ○ | ○ | ○ | ○ | ○ |
| 5 | | | 400 | ○ | ○ | ○ | ○ | ○ |

It was shown from Table 7 that so far as the heating temperature after depositing Cu is controlled to a temperature exceeding 300° C., even when the measurement number is increased, the low contact resistance with each of IGZO and ZTO can be surely achieved, whereas when the heating temperature is 300° C. or lower, scattering is found in the measured value of the contact resistance, and reproducibility is poor. While not shown in Table 7, even when the heating temperature was increased to 450° C. as an upper limit to be used in a process step of usual flat panel displays, the low contact resistance with each of IGZO and ZTO could be kept.

From the foregoing results, it was shown that in order to surely ensure the low contact resistance between the Cu film and each of IGZO and ZTO with good reproducibility, in general, it is effective to control the heating temperature after depositing Cu to higher than 300° C. and 450° C. or lower.

On the other hand, the oxide such as ITO and IZO could keep the low contact resistance regardless of the heating temperature after deposing Cu.

Figure 13:
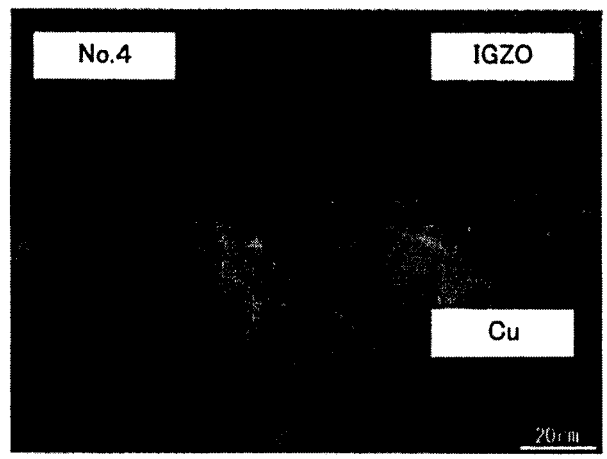
FIG. 13 is a TEM photograph (magnification: 1,500,000 times) regarding No. 4 in Table 7 (heat treatment temperature: 350° C.) after a heat treatment.

For reference, FIG. 13 (IGZO (In/Ga/Zn (atomic ratio): 1/1/1) shows a TEM photograph (magnification: 1,500,000 times) of No. 4 of Table 7 (heat treatment temperature: 350° C.) after the heat treatment. It could be confirmed through EDX analysis that Cu was diffused into the IGZO side to an extent of about 20 nm.

While the invention has been described in detail and with reference to specific embodiments thereof, it will be apparent to one skilled in the art that various changes and modifications can be made therein without departing from the spirit and scope thereof.

This application is based on Japanese Patent Application No. 2009-174801 filed on Jul. 27, 2009, Japanese Patent Application No. 2009-174802 filed on Jul. 27, 2009, Japanese Patent Application No. 2009-174803 filed on Jul. 27, 2009, Japanese Patent Application No. 2009-221470 filed on Sep. 25, 2009 and Japanese Patent Application No. 2009-221471 filed on Sep. 25, 2009, and the entire subject matter of which is incorporated herein by reference.

INDUSTRIAL APPLICABILITY

Figure 3:
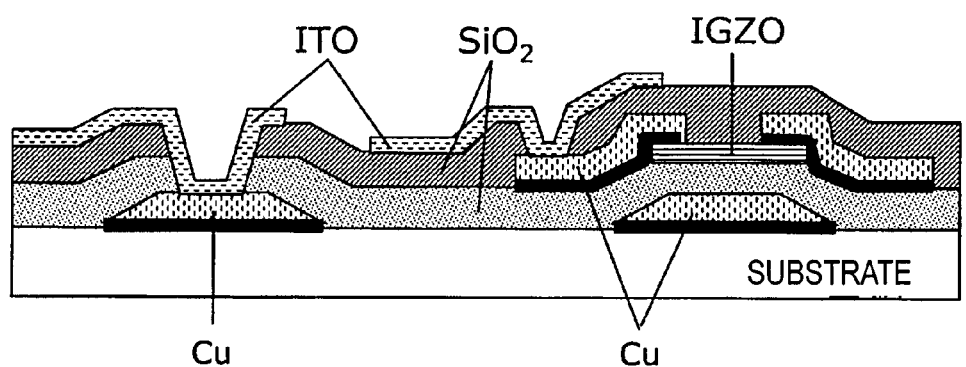
FIG. 3 is a schematic cross sectional explanatory view showing a conventional interconnection structure.

According to the invention, there could be provided an interconnection structure including an insulating film composed mainly of silicon oxide, silicon oxynitride or the like, a Cu alloy film, and an oxide semiconductor layer of a thin film transistor in this order from the side of the substrate, which has excellent adhesion even when the Cu alloy film is connected directly to the substrate and/or the insulating film, and is also capable of realizing low electrical resistance and low contact resistance with an oxide semiconductor layer and/or a transparent conductive film constituting a pixel electrode as characteristic features of a Cu based material. According to the invention, since a high melting point metal (barrier metal layer) such as Ti and Mo can be omitted, the problems which the conventional interconnection structure shown in FIG. 3 involve (such as a problem that the effective channel length is not determined) can be dissolved.

Also, since the interconnection structure of the invention is constituted as described above, low contact resistance between the Cu film and the oxide semiconductor layer formed thereon can be surely ensured with good reproducibility.

Figure 5:
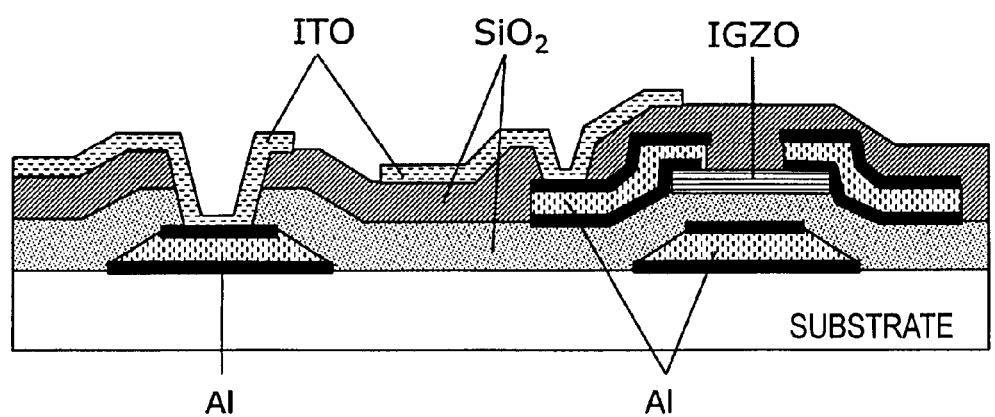
FIG. 5 is a schematic cross sectional explanatory view showing a conventional interconnection structure.

Also, according to the invention, there could be provided an interconnection structure including an Al alloy film and an oxide semiconductor layer of a thin film transistor connected to the Al alloy film in this order, which is capable of realizing low contact resistance even when the Al alloy film is connected directly to the oxide semiconductor layer. According to the invention, since a high melting point metal (barrier metal layer) such as Ti and Mo can be omitted, the problems which the interconnection structure shown in FIG. 5 involves (such as a problem that the effective channel length is not determined) can be dissolved.

The invention claimed is:
1. An interconnection structure including a layer of interconnection film and a semiconductor layer of a thin film transistor above a substrate in this order from the side of a substrate, wherein
  (1) the semiconductor layer is composed of an oxide semiconductors;
  (2) the layer of interconnection film is connected directly to a transparent conductive film constituting a pixel electrode on the same plane where the layer of interconnection film is connected directly to the semiconductor layer; and
  (3) the layer of interconnection film is an Al alloy film containing at least one of Ni and Co and is connected directly to the semiconductor layer, the layer of interconnection film is a Cu alloy film and is connected directly to the semiconductor layer, or the layer of interconnection film is a Cu film and is connected directly to the semiconductor layer.

2. The interconnection structure according to claim 1, wherein the layer of interconnection film is a Cu alloy film and is connected directly to the semiconductor layer.

3. The interconnection structure according to claim 1, wherein the layer of interconnection film is an Al alloy film containing at least one of Ni and Co and is connected directly to the semiconductor layer.

4. The interconnection structure according to claim 3, wherein the Al alloy film contains at least one of Ni and Co in an amount of from 0.1 to 2 atomic %.

5. The interconnection structure according to claim 3, wherein a part of at least one of Ni and Co is deposited and/or enriched at an interface between the Al alloy film and the semiconductor layer.

6. The interconnection structure according to claim 3, wherein the Al alloy film further contains at least one of Cu and Ge in an amount of from 0.05 to 2 atomic %.

7. The interconnection structure according to claim 3, wherein the Al alloy film further contains a rare earth element in an amount of from 0.05 to 1 atomic %.

8. The interconnection structure according to claim 3, wherein an irregularity having a maximum height roughness Rz of 5 nm or more is formed on a surface of the Al alloy film connected directly to the semiconductor layer.

9. The interconnection structure according to claim 1, which includes an insulating film between the layer of interconnection film and the substrate.

10. The interconnection structure including an insulating film, an interconnection film, and a semiconductor layer of a thin film transistor above a substrate in this order from the side of a substrate, wherein
the semiconductor layer is composed of an oxide semiconductor,
the interconnection film is a Cu alloy film and has a laminated structure including
a first layer (Y) composed of a Cu alloy containing at least one element selected from the group consisting of Zn, Ni, Ti, Al, Mg, Ca, W, Nb, and Mn in an amount of from 2 to 20 atomic % in total; and
a second layer (X) composed of pure Cu or a Cu alloy containing Cu as a main component, which has an electrical resistivity lower than the first layer (Y),
wherein the first layer (Y) is connected directly to the insulating film; and
the second layer (X) is connected directly to the semiconductor layer.

11. The interconnection structure according to claim 10, wherein a film thickness of the first layer (Y) is 10 nm or more and 100 nm or less and is 60% or less of the whole film thickness of the Cu alloy film.

12. The interconnection structure according to claim 10, wherein a part of Mn is deposited and/or enriched at an interface between the insulating film, and the Cu alloy film.

13. The interconnection structure according to claim 9, wherein the interconnection film is a Cu alloy film containing at least one element selected from the group consisting of Mn, Ni, Zn, Al, Ti, Mg, Ca, W, and Nb and is connected directly to the insulating film, and the semiconductor layer.

14. The interconnection structure according to claim 13, wherein the Cu alloy film contains at least one element selected from the group consisting of Mn, Ni, Zn, Al, Ti, Mg, Ca, W, and Nb in an amount of from 0.5 to 10 atomic %.

15. The interconnection structure according to claim 13, wherein the Cu alloy film contains at least Mn in an amount of 0.5 atomic % or more and at least one element selected from the group consisting of B, Ag, C, W, Ca, and Mg in an amount of 0.3 atomic % or more.

16. The interconnection structure according to claim 13, wherein a part of Mn is deposited and/or enriched at an interface between the insulating film and the Cu alloy film.

17. The interconnection structure according to claim 9, wherein the layer of interconnection film is a Cu film.

18. The interconnection structure according to claim 1, wherein the oxide semiconductor is composed of an oxide containing at least one element selected from the group consisting of In, Ga, Zn, Ti, and Sn.

19. A display device including the interconnection structure according to claim 1.

* * * * *